(12) United States Patent
Isobe

(10) Patent No.: US 8,049,253 B2
(45) Date of Patent: Nov. 1, 2011

(54) SEMICONDUCTOR DEVICE AND METHOD FOR MANUFACTURING THE SAME

(75) Inventor: Atsuo Isobe, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 70 days.

(21) Appl. No.: 12/216,567

(22) Filed: Jul. 8, 2008

(65) Prior Publication Data

US 2009/0014799 A1 Jan. 15, 2009

(30) Foreign Application Priority Data

Jul. 11, 2007 (JP) ................. 2007-181762

(51) Int. Cl.
*H01L 27/08* (2006.01)
*H01L 21/30* (2006.01)
(52) U.S. Cl. ............ 257/288; 257/351; 257/E27.046
(58) Field of Classification Search .............. 257/288; 438/458, 455
See application file for complete search history.

(56) References Cited

U.S. PATENT DOCUMENTS

| 5,374,564 | A | 12/1994 | Bruel |
| 5,426,315 | A | 6/1995 | Pfiester |
| 5,757,047 | A | 5/1998 | Nakamura |
| 5,933,736 | A | 8/1999 | Nakamura |
| 6,127,702 | A * | 10/2000 | Yamazaki et al. ............ 257/347 |
| 6,271,101 | B1 | 8/2001 | Fukunaga |
| 6,320,228 | B1 * | 11/2001 | Yu ............................ 257/350 |
| 6,335,231 | B1 | 1/2002 | Yamazaki et al. |
| 6,380,046 | B1 | 4/2002 | Yamazaki |
| 6,388,652 | B1 | 5/2002 | Yamazaki et al. |
| 6,602,761 | B2 | 8/2003 | Fukunaga |
| 6,686,623 | B2 | 2/2004 | Yamazaki |
| 6,778,164 | B2 | 8/2004 | Yamazaki et al. |
| 6,803,264 | B2 | 10/2004 | Yamazaki et al. |
| 6,821,826 | B1 | 11/2004 | Chan et al. |
| 6,875,633 | B2 | 4/2005 | Fukunaga |
| 7,067,926 | B2 | 6/2006 | Yamazaki et al. |
| 7,105,448 | B2 | 9/2006 | Takayama et al. |
| 7,176,525 | B2 | 2/2007 | Fukunaga |
| 7,199,024 | B2 | 4/2007 | Yamazaki |
| 7,256,776 | B2 | 8/2007 | Yamazaki et al. |
| 2003/0171837 | A1 * | 9/2003 | Yamazaki et al. ............ 700/121 |

(Continued)

FOREIGN PATENT DOCUMENTS

JP 05-335482 12/1993

(Continued)

*Primary Examiner* — Jarrett Stark
*Assistant Examiner* — Lawrence Tynes, Jr.
(74) *Attorney, Agent, or Firm* — Eric J. Robinson; Robinson Intellectual Property Law Office, P.C.

(57) ABSTRACT

A semiconductor device and a method for manufacturing a semiconductor device are provided. A semiconductor device comprises a first single-crystal semiconductor layer including a first channel formation region and a first impurity region over a substrate having an insulating surface, a first gate insulating layer over the first single-crystal semiconductor layer, a gate electrode over the first gate insulating layer, a first interlayer insulating layer over the first gate insulating layer, a second gate insulating layer over the gate electrode and the first interlayer insulating layer, and a second single-crystal semiconductor layer including a second channel formation region and a second impurity region over the second gate insulating layer. The first channel formation region, the gate electrode, and the second channel formation region are overlapped with each other.

7 Claims, 19 Drawing Sheets

U.S. PATENT DOCUMENTS

| | | |
|---|---|---|
| 2004/0104424 A1 | 6/2004 | Yamazaki |
| 2004/0195572 A1 | 10/2004 | Kato et al. |
| 2005/0009252 A1 | 1/2005 | Yamazaki et al. |
| 2005/0026339 A1* | 2/2005 | Gonzalez ................ 438/152 |
| 2005/0067620 A1 | 3/2005 | Chan et al. |
| 2005/0069788 A1 | 3/2005 | Tanaka et al. |
| 2005/0127371 A1* | 6/2005 | Yamazaki et al. ........ 257/72 |
| 2006/0071074 A1* | 4/2006 | Konevecki et al. ....... 235/454 |
| 2006/0214306 A1 | 9/2006 | Yamazaki et al. |
| 2006/0292879 A1 | 12/2006 | Takayama et al. |
| 2007/0090417 A1* | 4/2007 | Kudo ...................... 257/288 |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0291022 A1 | 12/2007 | Yamazaki et al. |

FOREIGN PATENT DOCUMENTS

| | | |
|---|---|---|
| JP | 07-193188 | 7/1995 |
| JP | 2003-234474 | 8/2003 |
| JP | 2005-107195 | 4/2005 |
| JP | 2005-109498 | 4/2005 |
| JP | 2006-147897 | 6/2006 |
| JP | 2006-287238 | 10/2006 |

* cited by examiner

SEMICONDUCTOR DEVICE AND METHOD FOR MANUFACTURING THE SAME

BACKGROUND OF THE INVENTION

1. Field of the Invention

The present invention relates to semiconductor devices and a method for manufacturing the semiconductor devices, and electronic devices.

2. Description of the Related Art

At present, semiconductor integrated circuits are improved in performance mainly by making a process rule fine (here, "a process rule" refers to a minimum line width inside a semiconductor device). In recent years, the adoption of a process rule such as 65 nm or 45 nm has begun, and accordingly, the miniaturization of semiconductor elements has been aggressively spurred (for example, see Japanese Published Patent Application No. 2005-107195 and Japanese Published Patent Application No. 2006-147897).

SUMMARY OF THE INVENTION

However, in the case where high integration (so to speak, two-dimensional high integration) is advanced by making a process rule fine as described above, the high integration will reach the physical limit soon. For example, it is difficult to make a process rule fine beyond the resolution limit of an exposure machine for forming a circuit pattern. Even if an atomic-scale line width (for example, a line, width approximately less than or equal to several nanometers) can be achieved, it is difficult to realize operation like conventional operation due to increase in leakage current or increase in error.

Further, in the case of a semiconductor device using an inexpensive substrate such as a glass substrate, the substrate itself has an undulation of approximate several tens of micrometers. Therefore, it is necessary to ensure sufficient depth of focus in light exposure; however, resolution is lowered if depth of focus is ensured. Accordingly, the integration degree of a semiconductor device using an inexpensive substrate such as a glass substrate is lowered as compared to the integration degree of so-called LSI. That is, it can be said that high integration of a semiconductor device using an inexpensive substrate such as a glass substrate is more difficult to achieve than the case of an LSI.

In view of the foregoing problems, it is an object of the present invention to provide a semiconductor device in which the foregoing problems on higher integration and reduction in size are solved. It is another object of the present invention to solve the foregoing problems inexpensively by suppressing increase in the number of steps.

According to the present invention, three-dimensional integration is achieved instead of two-dimensional integration. Thus, integration of a semiconductor device can be achieved without depending on making a process rule fine. In specific, a semiconductor device is manufactured using two or more single-crystal semiconductor layers which are stacked. Further, a conductive layer for applying an electric field to a single-crystal semiconductor layer is shared in common. Accordingly, high integration can be achieved at low cost. Here, as a method for stacking single-crystal semiconductor layers, an ion implantation and separation method is used.

One aspect of a semiconductor device of the present invention includes a first single-crystal semiconductor layer over an insulating surface, a first insulating layer over the first single-crystal semiconductor layer, a conductive layer over the first insulating layer, a second insulating layer over the conductive layer, and a second single-crystal semiconductor layer over the second insulating layer.

Another aspect of a semiconductor device of the present invention includes a first single-crystal semiconductor layer over an insulating surface, a first insulating layer over the first single-crystal semiconductor layer, a conductive layer over the first insulating layer, a second insulating layer over the conductive layer, and a second single-crystal semiconductor layer over the second insulating layer, where the conductive layer is used to apply an electric field to the first single-crystal semiconductor layer and the second single-crystal semiconductor layer via the first insulating layer and the second insulating layer.

In the above-described structure, a first transistor with a top-gate structure is formed using the first single-crystal semiconductor layer, the first insulating layer, and the conductive layer, and a second transistor with a bottom-gate structure is formed using the conductive layer, the second insulating layer, and the second single-crystal semiconductor layer.

Further, in the above-described structure, either impurity elements which impart the same conductivity type or impurity elements which impart different conductivity types may be added to respective source or drain regions of the first transistor and the second transistor.

In the case where impurity elements which impart different conductivity types are added as described above, a complementary semiconductor device can be formed using a first transistor and a second transistor. Further, various electronic devices can be provided using the above-described semiconductor devices.

One aspect of a method for manufacturing a semiconductor device of the present invention includes the steps of bonging a surface of a first single-crystal semiconductor substrate having a first damaged region to a first insulating layer formed over a surface of a substrate having an insulating surface, separating the first single-crystal semiconductor substrate in the first damaged region to form a first single-crystal semiconductor layer over the substrate having an insulating surface, forming a second insulating layer over the first single-crystal semiconductor layer, forming a conductive layer in a region overlapping with part of the first single-crystal semiconductor layer over the second insulating layer, forming a third insulating layer so as to cover the second insulating layer and the conductive layer, planarizing an upper surface of the third insulating layer, forming a fourth insulating layer over the third insulating layer, bonding a surface of a second single-crystal semiconductor substrate having a second damaged region to the fourth insulating layer, and separating the second single-crystal semiconductor substrate in the second damaged region to form a second single-crystal semiconductor layer over the substrate having an insulating surface.

Another aspect of a method for manufacturing a semiconductor device of the present invention includes the steps of bonging a first insulating layer formed over a surface of a first single-crystal semiconductor substrate having a first damaged region to a surface of a substrate having an insulating surface, separating the first single-crystal semiconductor substrate in the first damaged region to form a first single-crystal semiconductor layer over the substrate having an insulating surface, forming a second insulating layer over the first single-crystal semiconductor layer, forming a conductive layer in a region overlapping with part of the first single-crystal semiconductor layer over the second insulating layer, forming a third insulating layer so as to cover the second insulating layer and the conductive layer, planarizing an upper surface of the third insulating layer, forming a fourth insulating layer over the third insulating layer, bonding a surface of a second single-crystal semiconductor substrate having a second damaged region to the fourth insulating layer, and separating the second single-crystal semiconductor substrate in the second damaged region to form a second single-crystal semiconductor layer over the substrate having an insulating surface.

In the above-described structure, a first transistor with a top-gate structure can be formed using the first single-crystal semiconductor layer, the second insulating layer, and the conductive layer, and a second transistor with a bottom-gate structure can be formed using the conductive layer, the fourth insulating layer, and the second single-crystal semiconductor layer.

Further, in the above-described structure, either impurity elements which impart the same conductivity type or impurity elements which impart different conductivity types may be added to respective source or drain regions of the first transistor and the second transistor.

Note that in the present invention, a semiconductor device refers to a display device such as a liquid crystal display device and an electroluminescence display device; a wireless tag which is referred to as an RFID (radio frequency identification) tag, an RF tag, an RF chip, a wireless processor, a wireless memory, an IC (integrated circuit) tag, an IC label, an electronic tag, an electronic chip, or the like; a microprocessor such as a CPU (central processing unit); an integrated circuit; and any other devices using a single-crystal semiconductor layer which is formed over an insulating surface.

According to the present invention, a highly-integrated semiconductor device can be provided while increase in the number of steps is suppressed; that is, a smaller-sized semiconductor device can be provided. Further, a high-performance semiconductor device can be provided. Accordingly, a high-performance semiconductor device can be provided at low cost.

DETAILED DESCRIPTION OF THE INVENTION

Embodiment Mode

Figure 1A:
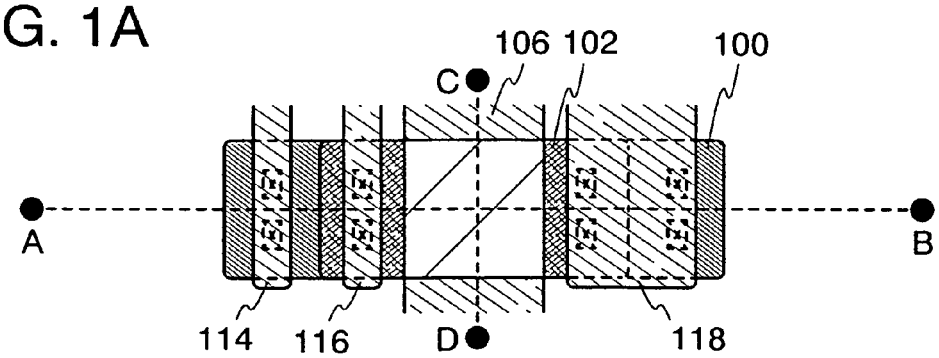
FIGS. 1A to 1D are diagrams showing an example of a semiconductor device of the present invention.

Embodiment Modes of the present invention will be described below with reference to the accompanying drawings. However, it is easily understood by those skilled in the art that various changes may be made in forms and details without departing from the spirit and the scope of the invention. Therefore, the present invention should not be interpreted as being limited to the description of the embodiment modes to be given below. Note that in structures of the present invention which are described below, like reference numerals are used for like portions throughout the drawings.

Embodiment Mode 1

This embodiment mode describes an example of a method for manufacturing a semiconductor device of the present invention, with reference to FIGS. 1A to 1D, FIGS. 2A to 2D, FIGS. 3A to 3D, FIGS. 4A to 4C, FIGS. 5A to 5C, FIGS. 6A to 6C, and FIGS. 7A to 7C.

Figure 1B:
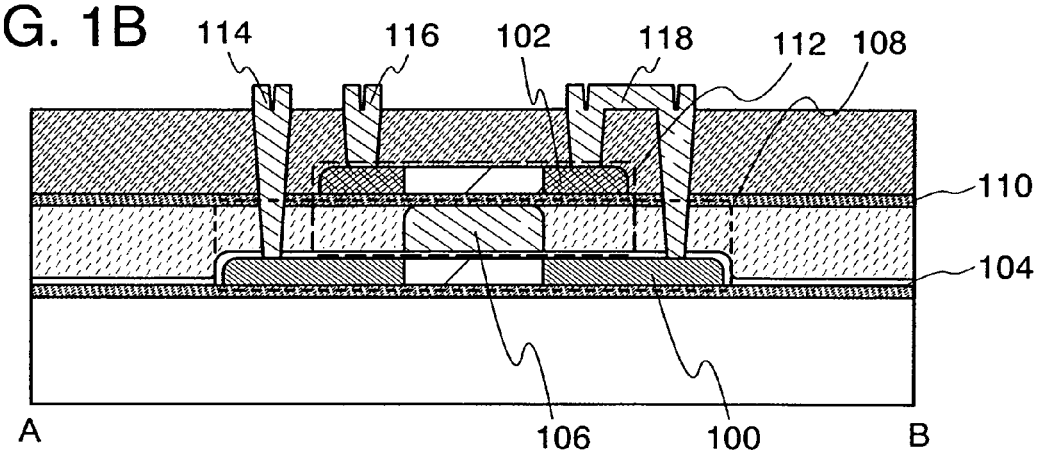
Figure 1C:
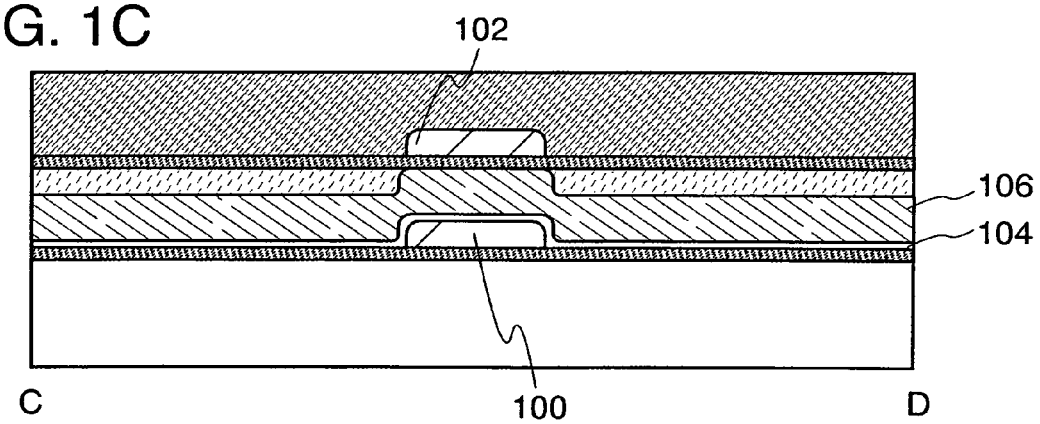

FIGS. 1A to 1D illustrate an example of a structure of a semiconductor device of the present invention. FIG. 1A is a plan view of a semiconductor device of the present invention. FIG. 1B is a cross-sectional view taken along line A-B in FIG. 1A, and FIG. 1C is a cross-sectional view taken along line C-D in FIG. 1A. The structure shown in FIGS. 1A to 1D is just an example, and the present invention is not limited to the structure.

The semiconductor device illustrated in FIGS. 1A to 1D includes two single-crystal semiconductor layers (a single-crystal semiconductor layer 100 and a single-crystal semiconductor layer 102). A first transistor 108 includes the single-crystal semiconductor layer 100 as well as an insulating layer 104 and a conductive layer 106. A second transistor 112 includes the single-crystal semiconductor layer 102 as well as the conductive layer 106 and an insulating layer 110. Here, the first transistor 108 is an n-channel transistor and the second transistor 112 is a p-channel transistor. Further, a source or drain electrode 114 (hereinafter, also referred to as a source or drain wiring) is electrically connected to part of a source or drain region of the first transistor 108, a source or drain electrode 116 is electrically connected to part of a source or drain region of the second transistor 112. Further, a source or drain electrode 118 is provided so as to electrically connect source or drain regions of the first transistor and the second transistor.

Figure 1D:
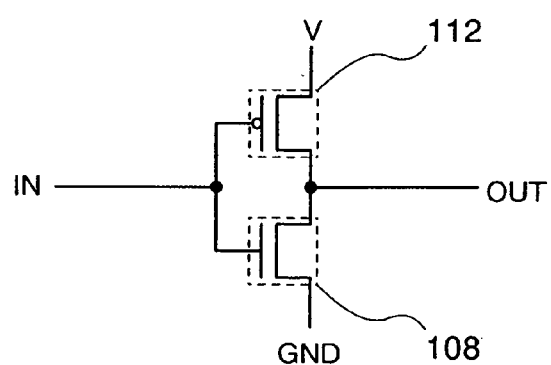

FIG. 1D is a circuit diagram of the above-described semiconductor device. As illustrated in FIG. 1D, a complementary circuit (in more detail, a CMOS inverter circuit) is formed of the first transistor 108 and the second transistor 112. The conductive layer 106 serves as a gate electrode of the first transistor 108 and the second transistor 112, and corresponds to an input terminal of a CMOS circuit. Further, the source or drain electrode 118 corresponds to an output terminal of the CMOS circuit.

When a semiconductor element (for example, a transistor) is formed by stacking single-crystal semiconductor layers as illustrated in FIGS. 1A to 1D, a highly-integrated semiconductor device can be manufactured. Further, in the present invention, since all semiconductor elements are formed using a single-crystal semiconductor, a semiconductor device with excellent characteristics can be provided as compared to the case of using an amorphous semiconductor or a polycrystalline semiconductor. Furthermore, in the present invention, a conductive layer for applying an electric field to a single-crystal semiconductor layer is shared in common; thus, it is not necessary to provide a conductive layer in each transistor. That is, it is not necessary that a plurality of conductive layers is stacked; thus, a semiconductor device can be manufactured at low cost. The above-described merit is remarkable in the case of forming a complementary circuit (also referred to as a CMOS circuit or a complementary semiconductor device) as illustrated in FIGS. 1A to 1D.

Next, an example of a method for manufacturing a semiconductor device of the present invention is described hereinafter with reference to FIGS. 2A to 2D, FIGS. 3A to 3D, FIGS. 4A to 4C, FIGS. 5A to 5C, FIGS. 6A to 6C, and FIGS. 7A to 7C.

First, a single-crystal semiconductor substrate 200 is prepared. Then, a surface of the single-crystal semiconductor substrate 200 is irradiated with ions to form a damaged region 202 and a single-crystal semiconductor layer 204 in the single-crystal semiconductor substrate 200 (see FIG. 2A). As a method for forming the damaged region 202, a method used for adding an impurity element to a semiconductor layer (an ion doping method), a method for performing mass separation of an ionized gas to be selectively implanted into a semiconductor layer (an ion implantation method), and the like can be given. Ion irradiation may be performed in consideration of the thickness of the single-crystal semiconductor layer 204 which is formed. The thickness of the single-crystal semiconductor layer 204 may be approximately 5 to 500 nm, and a thickness of 10 to 200 nm is more preferable. An accelerating voltage at ion irradiation can be determined in consideration of the above-described thickness.

The single-crystal semiconductor substrate 200 is not particularly limited as long as it is a substrate made of a single-crystal semiconductor. In this embodiment mode, a single-crystal silicon substrate is used as an example. Alternatively, a substrate made of germanium or a substrate made of a compound semiconductor such as gallium arsenide or indium phosphide may be used.

As ions for irradiation, ions of hydrogen, helium, halogen typified by fluorine, and the like can be given. When fluorine ions are used as halogen ions for irradiation, $BF_3$ may be used as a source gas. For example, when a single-crystal silicon substrate is used as the single-crystal semiconductor substrate 200 and the single-crystal silicon substrate is irradiated with halogen ions like fluorine ions, microvoids are formed in the damaged region 202. This is because introduced halogen ions purge silicon atoms in a silicon crystal lattice. The volumes of the microvoids thus formed are changed, so that the single-crystal silicon substrate can be separated. Specifically, the volume change of the microvoids is induced by low-temperature heat treatment. Note that hydrogen ion irradiation may be performed to contain hydrogen in the voids after fluorine ion irradiation is performed.

Alternatively, the single-crystal silicon substrate may be irradiated with a plurality of ions of the same atom, the masses of which are different. For example, in the case of using hydrogen, $H^+$, $H_2^+$, and $H_3^+$ ions are contained and further $H_3^+$ ions may be contained at a high proportion. When $H_3^+$ ions are contained at a high proportion, the irradiation efficiency can be increased; thus, the irradiation time can be shortened.

Note that a protective layer may be formed over the surface of the single-crystal semiconductor substrate 200 before the damaged region 202 is formed. By forming the protective layer, roughness of the surface of the single-crystal semiconductor substrate, which accompanies ion irradiation, can be reduced. For the protective layer, silicon oxide, silicon nitride, silicon nitride oxide, silicon oxynitride, or the like can be used.

Note that silicon oxynitride means a substance that contains more oxygen than nitrogen and includes, for example, oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0.1 atomic % and less than or equal to 10 atomic %, respectively. Further, silicon nitride oxide means a substance that contains more nitrogen than oxygen and includes, for example, oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 25 atomic %, respectively. The aforementioned ranges are ranges for cases measured using Rutherford backscattering spectrometry (RBS) and hydrogen forward scattering (HFS). Total percentage of the constituent elements does not exceed 100 atomic %.

Figure 2A:
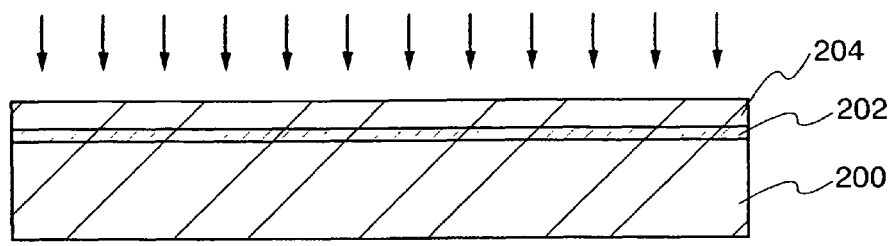
FIGS. 2A to 2D are diagrams showing a manufacturing process of a semiconductor device of the present invention.
Figure 2B:
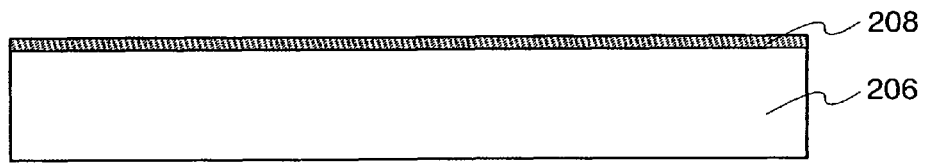

Next, a bonding layer 208 is formed over a substrate 206 having an insulating surface (see FIG. 2B). For the bonding layer 208, a silicon oxide film may be formed by a chemical vapor deposition (CVD) method using an organosilane gas. Alternatively, a silicon oxide film formed by a chemical vapor deposition method using a silane gas can be used. Note that since the bonding layer 208 is formed from an insulating material, the bonding layer 208 can be referred to as an insulating layer.

As the substrate 206 having an insulating surface, any of a variety of glass substrates which are used in the electronics industry such as an aluminosilicate glass substrate, an aluminoborosilicate glass substrate, and a barium borosilicate glass substrate; a quartz substrate; a ceramic substrate; a sapphire substrate; or the like can be used. A glass substrate is preferably used, and a mother glass substrate having a large area can be used, such as a so-called sixth generation substrate (1500 mm×1850 mm), a so-called seventh generation substrate (1870 mm×2200 mm), and a so-called eighth generation substrate (2200 mm×2400 mm), for example. A mother glass substrate having a large area is used as the substrate 206 having an insulating surface, so that the area of the semiconductor substrate can be enlarged. Note that the substrate 206 having an insulating surface is not limited to the above-described substrates. For example, a substrate made from a resin material can also be used if an upper temperature limit permits. It is needless to say that a single-crystal semiconductor substrate such as a silicon wafer may be used. In this case, a single-crystal semiconductor substrate over which an insulating layer is formed may be used. Further, a single-crystal semiconductor substrate, in which an element is provided in advance and over which an insulating layer is formed, may be used, whereby further integration can be achieved.

The bonding layer 208 is formed smoothly and has a hydrophilic surface. A silicon oxide film is appropriate as the bonding layer 208. In particular, a silicon oxide film which is formed by a chemical vapor deposition method, using an organosilane gas, is preferable. Examples of organosilane gases that can be used include silicon-containing compounds, such as tetraethoxysilane (TEOS) (chemical formula: $Si(OC_2H_5)_4$), trimethylsilane (chemical formula: $(CH_3)_3SiH$), tetramethylsilane $((CH_3)_4Si)$, tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), trisdimethylaminosilane (chemical formula: $SiH(N(CH_3)_2)_3$), and the like.

The above-described bonding layer 208 is formed to a thickness of approximately 5 to 500 nm. Accordingly, a surface on which a film is formed can be smoothed and smoothness of a growing surface of the film can be ensured. Further, it is possible to mitigate distortion with a substrate to be bonded. Note that the single-crystal semiconductor substrate 200 used in a subsequent step can also be provided with a similar bonding layer. As described above, a silicon oxide film which is formed using organic silane as a raw material is provided for either one or both of bonding surfaces, whereby an extremely strong bond can be formed.

Note that a barrier layer may be provided between the substrate 206 having an insulating surface and the bonding layer 208. The barrier layer may be formed using one or a plurality of materials selected from silicon nitride, silicon nitride oxide, or silicon oxynitride. Note that the barrier layer may have a single-layer structure or a stacked-layer structure. The barrier layer is provided to prevent impurities such as movable ions or moisture in the substrate 206 having an insulating surface from intruding into the bonding layer 208 or a layer which is formed over the bonding layer 208. Note that the barrier layer may be formed from a material other than the above-described material as long as intrusion of impurities can be prevented. If intrusion of impurities does not lead to any significant problems, a structure without a barrier layer may be employed.

In this embodiment mode, a case is described where the bonding layer 208 is formed over the substrate 206 having an insulating surface after the damaged region 202 is formed in the single-crystal semiconductor substrate 200. However, the present invention is not limited thereto. In the present invention, it is acceptable as long as the substrate 206 having an insulating surface is provided with the single-crystal semiconductor layer 204. Thus, there is no particular limitation on the order of formation of the damaged region 202 and the bonding layer 208. For example, the damaged region 202 may be formed in the single-crystal semiconductor substrate 200 after the bonding layer 208 is formed over the substrate 206 having an insulating surface. There is no particular limitation on the order of formation of the bonding layer 208 and the damaged region 202. The bonding layer 208 and the damaged region 202 can be formed with separate timings.

Figure 2C:
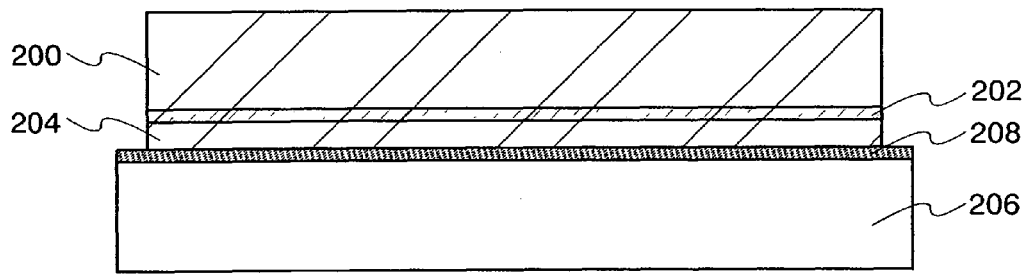

Next, the bonding layer 208 and the single-crystal semiconductor layer 204 are disposed in close contact with each other (see FIG. 2C). The bonding layer 208 and the single-crystal semiconductor layer 204 are disposed in close contact with each other and pressure is applied thereto, so that a strong bond can be formed by hydrogen bonds and covalent bonds. Note that it is preferable to perform heat treatment after the substrate 206 having an insulating surface and the single-crystal semiconductor substrate 200 are bonded to each other, with the bonding layer 208 interposed therebetween. The bonding strength can be further improved by performing heat treatment. Note that a base layer may be formed between the bonding layer 208 and the single-crystal semiconductor layer 204. By forming the base layer, impurities such as movable ions can be prevented from intruding into the single-crystal semiconductor layer 204. The base layer can be manufactured using a material similar to that of the barrier layer; however, the present invention is not limited thereto. For example, the base layer can be formed by stacking a silicon oxynitride film and a silicon nitride oxide film in this order from the single-crystal semiconductor layer 204 side.

In order to form a favorable bond, the surface which is to form a bond may be activated. For example, the surface which is to form a bond is irradiated with an atomic beam or an ion beam. When an atomic beam or an ion beam is used, an inert gas atomic beam or inert gas ion beam of argon or the like can be used. Alternatively, plasma treatment or radical treatment is performed. Such surface treatment makes it possible to form a bond between different kinds of materials at a low temperature of approximately from 200 to 400° C.

Figure 2D:
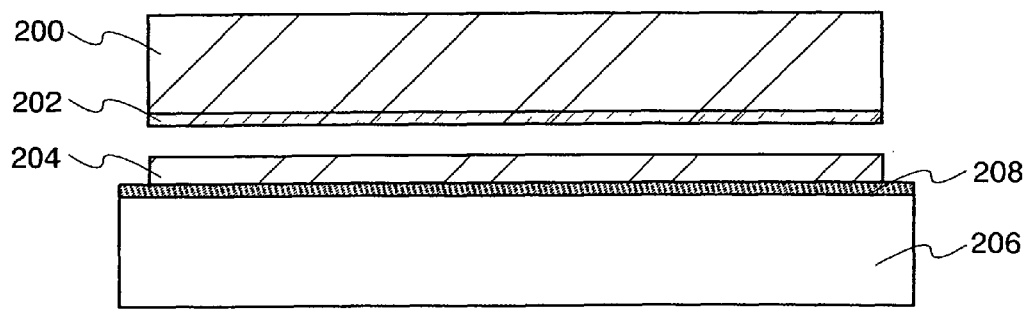

Next, heat treatment is performed to separate the single-crystal semiconductor layer 204 from the single-crystal semiconductor substrate 200 using part of the damaged region 202 as a separation plane (see FIG. 2D). For example, heat treatment at 400 to 600° C. is performed, so that the single-crystal semiconductor layer 204 can be separated by inducing the volume change of the microvoids which are formed in the damaged region 202. Since the bonding layer 208 is bonded to the substrate 206 having an insulating surface, the single-crystal semiconductor layer 204 is to remain over the substrate 206 having an insulating surface. In FIGS. 2A to 2D, separation is performed at the interface between the damaged region 202 and the single-crystal semiconductor layer 204; however, the present invention is not limited thereto. For example, separation may be performed at the interface between the damaged region 202 and the single-crystal semiconductor substrate 200 or may be performed in part of the damaged region 202. It is likely that regions where separation occurs are different depending on conditions in forming the damaged region 202.

When a glass substrate is used as the substrate 206 having an insulating surface, heating may be performed approximately at a strain point of a glass substrate, specifically at a temperature in a range from minus 50° C. to plus 50° C. of the strain point. More specifically, heat treatment may be performed at a temperature greater than or equal to 580° C. and less than or equal to 680° C. (in the case where the strain point of a glass substrate is approximately 630° C.). Note that a glass substrate has a property of contraction by heat. Therefore, when a glass substrate is heated approximately at a strain point, specifically at a temperature in a range from minus 50° C. to plus 50° C. of the strain point (or higher) in advance, contraction in subsequent heat treatment can be suppressed. Accordingly, even when heat treatment is performed on a glass substrate, to which a single-crystal semiconductor layer having a thermal expansion coefficient different from that of the glass substrate is bonded, separation of the single-crystal semiconductor layer from the glass substrate can be prevented. Further, transformation such as a warp of the glass substrate and the single-crystal semiconductor layer can be prevented.

Note that when a glass substrate is used, it is preferable to avoid rapid cooling at the termination of heating. Specifically, the glass substrate may be cooled down to a temperature less than or equal to a strain point at a speed of less than or equal to 2° C./min, preferably less than or equal to 0.5° C./min, more preferably less than or equal to 0.3° C./min. The temperature reduction rate is set at the above rate, so that local stress which is applied when the glass substrate is contracted can be eased. The heat treatment may be performed under atmospheric pressure or under reduced pressure. As to an atmosphere, a nitrogen atmosphere, an oxygen atmosphere, or the like can be set, as appropriate. Note that the heat treatment can be performed on any other substrates without limitation to a glass substrate, as long as a substrate having a property of contraction after heating is used.

Note that heat treatment related to the bonding step and heat treatment related to the separation step can be concurrently performed. In this case, two steps can be performed with single heat treatment; therefore, a semiconductor substrate can be manufactured at low cost.

A surface of the single-crystal semiconductor layer 204 which is obtained through the above-described steps is preferably planarized by chemical mechanical polishing (CMP), laser beam irradiation, dry etching, or the like. By improvement of the single-crystal semiconductor layer 204 in planarity, variation of semiconductor elements which will be subsequently formed can be suppressed. Note that CMP, laser beam irradiation, dry etching, or the like may be omitted if desired characteristics can be obtained. In the case of performing laser beam irradiation, defects due to ion irradiation can be reduced.

Figure 3A:
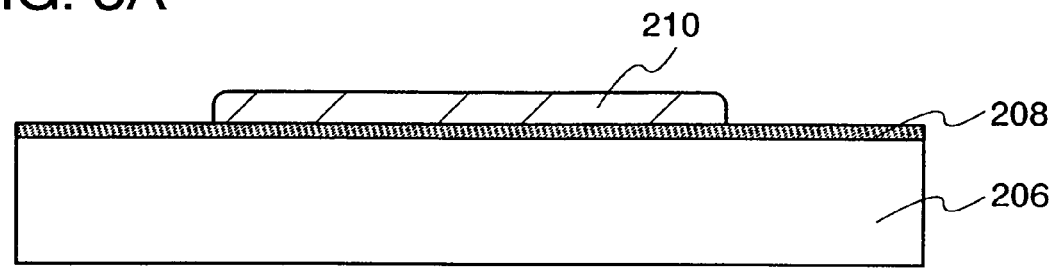
FIGS. 3A to 3D are diagrams showing a manufacturing process of a semiconductor device of the present invention.

Next, the single-crystal semiconductor layer 204 is patterned into a desired shape to form an island-shaped single-crystal semiconductor layer 210 (see FIG. 3A). As to an etching process in the patterning, either plasma etching (dry etching) or wet etching may be employed. In a case of processing a large-sized substrate, plasma etching is suitable. As to an etching gas, a fluorine-based or chlorine-based gas such as $CF_4$, $NF_3$, $Cl_2$, or $BCl_3$ is used, and an inert gas such as He or Ar may be added, as appropriate. In addition, when etching processing using atmospheric pressure discharge is applied, processing using local discharge can be performed, and it is not necessary to form a mask layer over an entire surface of the substrate.

After the island-shaped single-crystal semiconductor layer 210 is formed by patterning the single-crystal semiconductor layer 204, a p-type impurity such as boron, aluminum, or gallium may be added in order to control a threshold voltage. For example, as a p-type impurity, boron can be added at a concentration greater than or equal to $1\times10^{16}$ cm$^{-3}$ and less than or equal to $1\times10^{18}$ cm$^{-3}$. When a single-crystal semiconductor substrate with an impurity at appropriate concentration is used, a doping step for controlling a threshold voltage can be omitted.

Figure 3B:
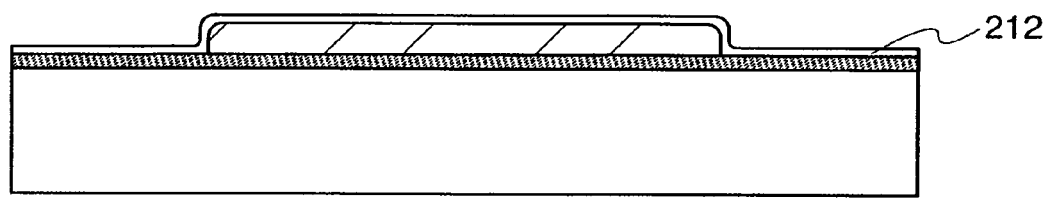

Next, an insulating layer 212 which covers the island-shaped single-crystal semiconductor layer 210 is formed (see FIG. 3B). The insulating layer 212 serves as a gate insulating layer. The insulating layer 212 is formed of a silicon-containing insulating film by a sputtering method, a CVD method, or the like to have a thickness approximately greater than or equal to 2 nm and less than or equal to 150 nm. Specifically, the insulating layer 212 may be formed from an oxide material or a nitride material of silicon which is typified by silicon nitride, silicon oxide, silicon oxynitride, and silicon nitride oxide; or the like. Note that the insulating layer 212 may have a single-layer structure or a stacked-layer structure. Further, a thin silicon oxide film having a thickness approximately greater than or equal to 1 nm and less than or equal to 100 nm, preferably greater than or equal to 1 nm and less than or equal to 10 nm, more preferably greater than or equal to 2 nm and less than or equal to 5 nm, may be formed between the island-shaped single-crystal semiconductor layer 210 and the insulating layer 212. Note that a rare gas element such as argon may be contained in a reactive gas in order to form a gate insulating layer with little leak current, at a low temperature.

Figure 3C:
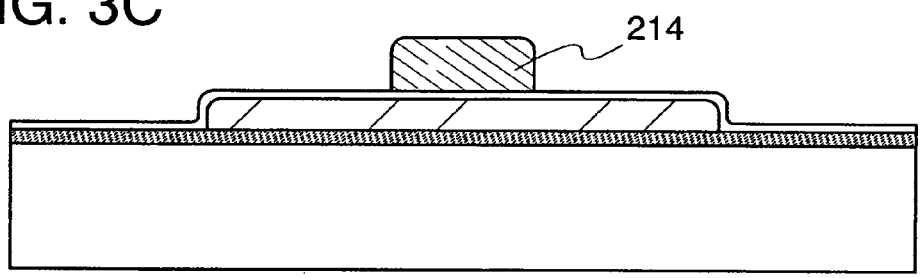

Next, a conductive layer is formed over the insulating layer 212, and the conductive layer is patterned to form a conductive layer 214 (see FIG. 3C). The conductive layer 214 serves as a gate electrode. The conductive layer 214 is formed to have a single-layer structure here; however, the present invention is not limited thereto. The conductive layer 214 may have a stacked-layer structure including two or more layers. It is preferable that the thickness of the conductive layer 214 be approximately greater than or equal to 20 nm and less than or equal to 500 nm. The conductive layer 214 can be formed by a sputtering method, an evaporation method, a CVD method, or the like. As materials which can be used, an element selected from tantalum (Ta), tungsten (W), titanium (Ti), molybdenum (Mo), aluminum (Al), copper (Cu), chromium (Cr), or neodymium (Nd), an alloy material or a compound material including any of the above elements as its main component, and the like can be given. Further, a semiconductor material typified by polycrystalline silicon that is doped with an impurity element such as phosphorus, an AgPdCu alloy, or the like may also be used.

Figure 3D:
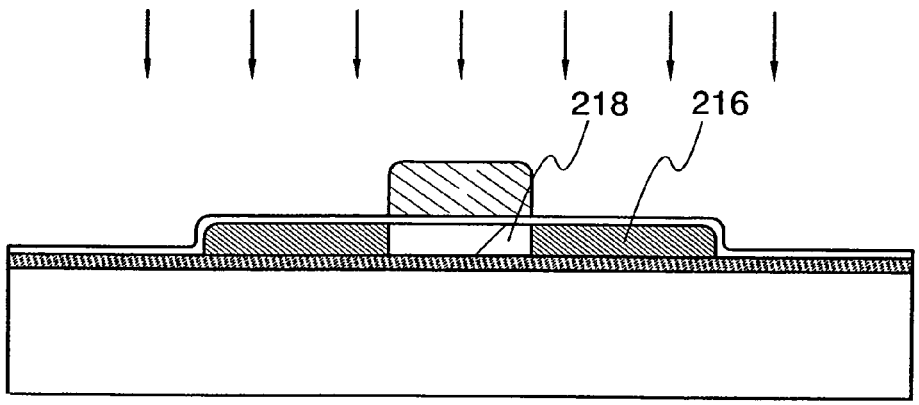

Next, an impurity element imparting n-type conductivity is added using the conductive layer 214 as a mask to form an impurity region 216 and a channel formation region 218 (see FIG. 3D). In this embodiment mode, doping is performed using phosphine ($PH_3$) as a doping gas containing an impurity element. Here, phosphorus (P), which is an impurity element imparting n-type conductivity, is made to contain in the impurity region 216 at a concentration which is approximately greater than or equal to $1\times10^{19}$/cm$^3$ and less than or equal to $1\times10^{21}$/cm$^3$.

In this embodiment mode, an impurity element imparting n-type conductivity is added to the island-shaped single-crystal semiconductor layer 210. However, the present invention is not limited thereto, and an impurity element imparting p-type conductivity may alternatively be added. In the case of adding an impurity element imparting p-type conductivity, the concentration of an impurity element (for example, boron) is set to be approximately greater than or equal to $1\times10^{20}$/cm$^3$ and less than or equal to $5\times10^{21}$/cm$^3$. Further, an LDD region may be formed between the impurity region 216 and the channel formation region 218. It is preferable that the concentration of an impurity element in the LDD region be approximately greater than or equal to $1\times10^{17}$/cm$^3$ and less than or equal to $1\times10^{19}$/cm$^3$.

Through the above-described steps, the island-shaped single-crystal semiconductor layer 210, the insulating layer 212, and the conductive layer 214 are formed, which are included in the first transistor. Note that heat treatment or the like may be performed to activate the impurity region 216.

Figure 4A:
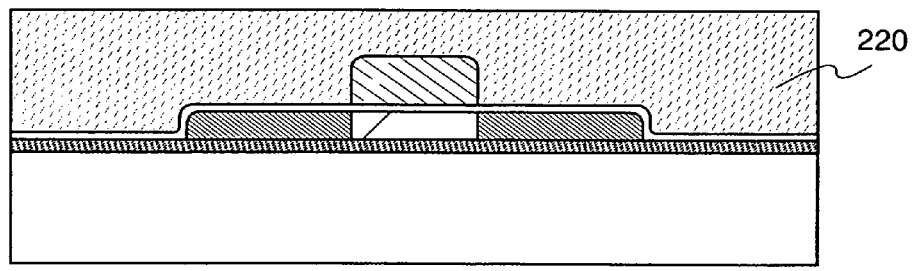
FIGS. 4A to 4C are diagrams showing a manufacturing process of a semiconductor device of the present invention.

Next, an insulating layer 220 is formed so as to cover the insulating layer 212 and the conductive layer 214 (see FIG. 4A). The insulating layer 212 can be formed by a sputtering method, an evaporation method, a CVD method, a coating method, or the like. The insulating layer 212 may be formed from an oxide material or a nitride material of silicon which is typified by silicon nitride, silicon oxide, silicon oxynitride, or silicon nitride oxide; or the like. Further, for the insulating layer 212, a material selected from aluminum oxide, aluminum nitride, aluminum oxynitride, aluminum nitride oxide which contains more nitrogen than oxygen, diamond-like carbon (DLC), carbon containing nitrogen, or other substances containing an inorganic insulating material may be used. Alternatively, a siloxane resin may be used. Note that a siloxane resin is a resin including a Si—O—Si bond. Siloxane is composed of a skeleton formed by the bond of silicon (Si) and oxygen (O), in which an organic group containing at least hydrogen (such as an alkyl group and aromatic hydrocarbon) is used as a substituent. Alternatively, a fluoro group may be included in the organic group. Further, an organic insulating material such as polyimide, acrylic, polyamide, polyimide amide, benzocyclobutene, or polysilazane may be used.

The insulating layer 220 is formed to planarize a region to be bonded to the single-crystal semiconductor layer in a later step. Accordingly, in the case where unevenness due to the island-shaped single-crystal semiconductor layer 210, the insulating layer 212, and the conductive layer 214 is sufficiently small, a structure without the insulating layer 220 may be employed. However, even when little unevenness exists, a defect of bonding may occur. Therefore, the insulating layer 220 is preferably provided.

Figure 4B:
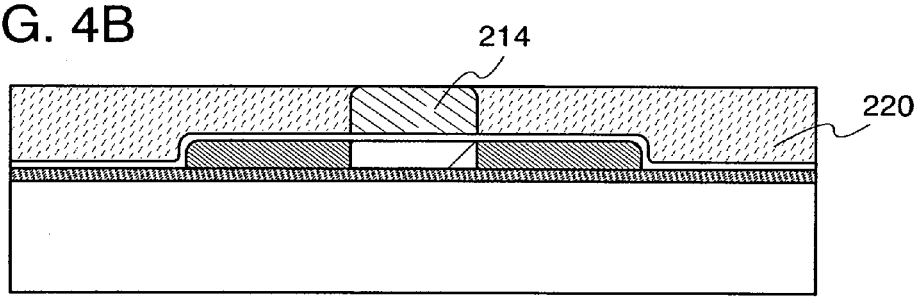
Figure 4C:
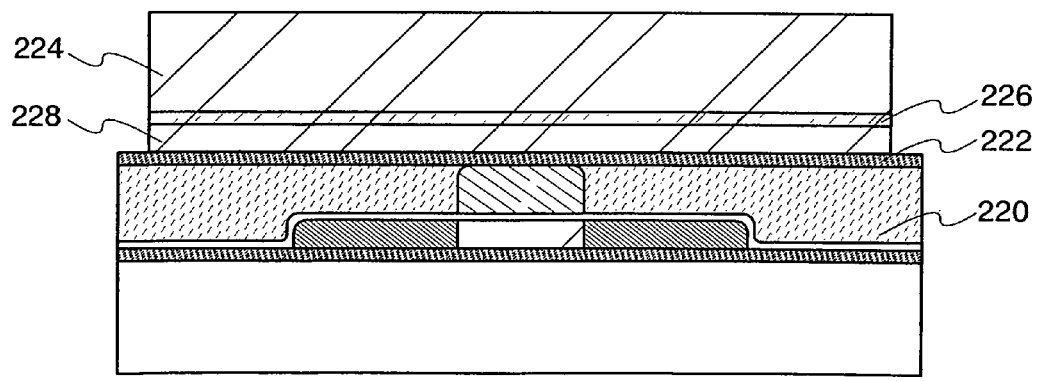

Next, an upper surface of the insulating layer 220 is planarized by a chemical mechanical polishing (CMP), laser beam irradiation, dry etching, or the like (see FIG. 4B). More specifically, planarization may be performed to the extent that a surface of the conductive layer 214 is exposed. Accordingly, a defect in bonding the single-crystal semiconductor layer in a later step can be drastically reduced. Here, in the case where an upper surface of the insulating layer 220 is sufficiently planarized, a step of the planarizarion may be omitted. By planarization (polishing or the like) being performed to the extent that the surface of the conductive layer 214 is exposed, only a bonding layer to be formed in a later step can be used as a gate insulating layer. Since the bonding layer is an extremely dense film and can be formed to be sufficiently thin, the bonding layer is preferable as a gate insulating layer. Thus, a transistor formed using the bonding layer has excellent characteristics.

Next, a bonding layer 222 is formed over the insulating layer 220. Further, ions are introduced to a predetermined depth from a surface of the single-crystal semiconductor substrate 224 to form a damaged region 226 and a single-crystal semiconductor layer 228. Subsequently, the bonding layer 222 and the single-crystal semiconductor layer 228 are disposed in close contact with each other (see FIG. 4C). The bonding layer 222 and the single-crystal semiconductor layer 228 are disposed in close contact with each other and pressure is applied thereto, so that a strong bond can be formed by hydrogen bonds and covalent bonds. Note that it is preferable to perform heat treatment after the bonding layer 222 and the single-crystal semiconductor layer 228 are disposed in close contact with each other. The bonding strength can be further improved by performing heat treatment. Further, a base layer may be formed between the bonding layer 222 and the single-crystal semiconductor layer 228. However, in the case where only the bonding layer 222 is used as a gate insulating layer, a base layer is not formed. In the case where the base layer is formed, the base layer may be formed from one or a plurality of materials selected from silicon nitride, silicon nitride oxide, or silicon oxynitride. Here, since the bonding layer 222 is formed from an insulating material, the bonding layer can be referred to as an insulating layer.

Note that either a step of forming the bonding layer 222 over the insulating layer 220 or a step of forming the damaged region 226 in the single-crystal semiconductor substrate 224 may be conducted first. There is no particular limitation on the order of formation of the bonding layer 222 and the damaged region 226. The bonding layer 222 and the damaged region 226 can be formed with separate timings. The detailed description on the bonding is omitted here, because it can be referred to the above-described case where the single-crystal semiconductor layer 204 and the bonding layer 208 are bonded to each other.

Figure 5A:
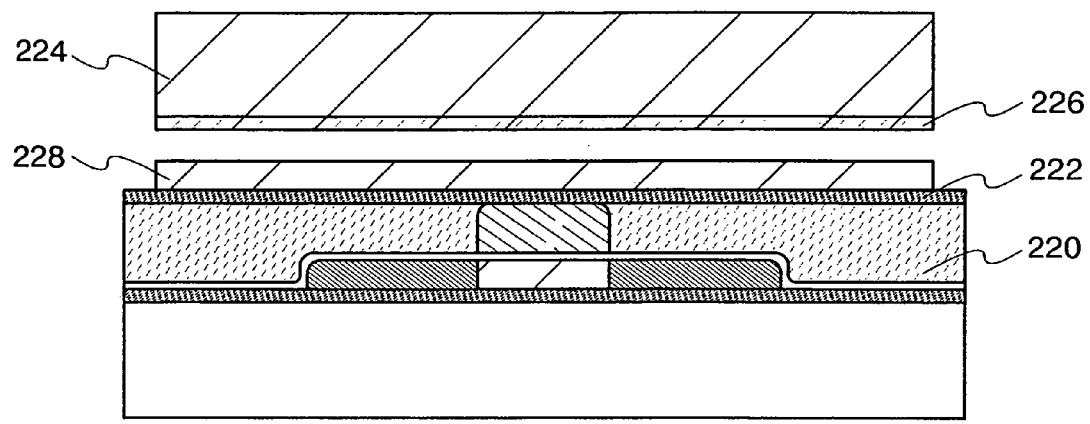
FIGS. 5A to 5C are diagrams showing a manufacturing process of a semiconductor device of the present invention.
Figure 5B:
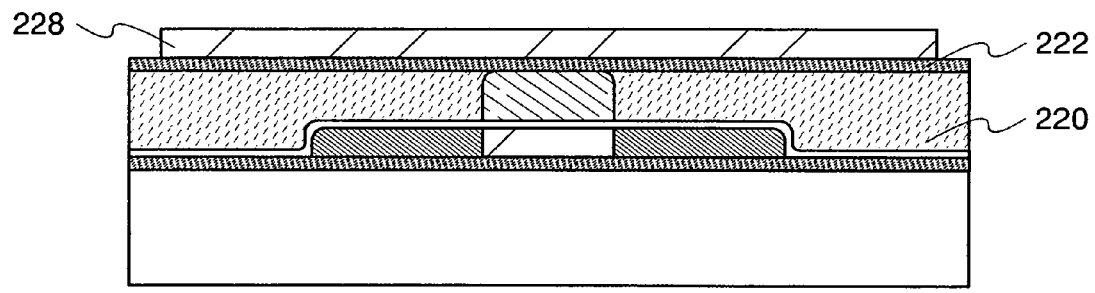
Figure 5C:
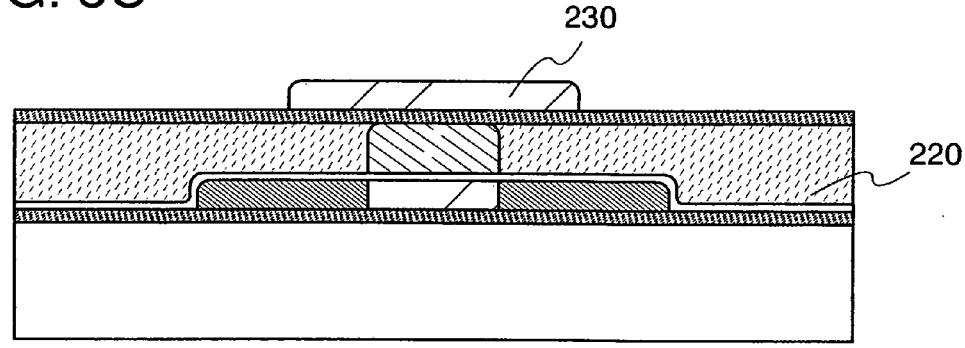

Next, heat treatment is performed to separate the single-crystal semiconductor layer 228 from the single-crystal semiconductor substrate 224 using part of the damaged region 226 as a separation plane (see FIG. 5A). For example, heat treatment at 400 to 600° C. is performed, so that the single-crystal semiconductor layer 228 can be separated by inducing the volume change of the microvoids which are formed in the damaged region 226. Accordingly, the single-crystal semiconductor layer 228 is to remain over the insulating layer 220. In FIGS. 5A to 5C, separation is performed at the interface between the damaged region 226 and the single-crystal semiconductor layer 228; however, the present invention is not limited thereto. For example, separation may be performed at the interface between the damaged region 226 and the single-crystal semiconductor substrate 224 or may be performed in part of the damaged region 226. It is likely that regions where separation occurs are different depending on conditions in forming the damaged region 226.

The detailed description on heating conditions in the separation is omitted here, because it can be referred to the above-described case where the single-crystal semiconductor layer 204 is formed. Through the above-described steps, the single-crystal semiconductor layer 228 can be formed over the insulating layer 220 (see FIG. 5B).

A surface of the single-crystal semiconductor layer 228 which is obtained through the above-described steps is preferably planarized by chemical mechanical polishing (CMP), laser beam irradiation, dry etching, or the like. By improvement of the single-crystal semiconductor layer 228 in planarity, variation of semiconductor elements which will be subsequently formed can be suppressed. Note that CMP, laser beam irradiation, dry etching, or the like may be omitted, if desired characteristics can be obtained. In the case of performing laser beam irradiation, defects due to ion implantation can be reduced.

Next, the single-crystal semiconductor layer 228 is patterned into a desired shape to form an island-shaped single-crystal semiconductor layer 230 (see FIG. 5C). As to an etching process in the patterning, either plasma etching (dry etching) or wet etching may be employed. In a case of processing a large-sized substrate, plasma etching is suitable. As to an etching gas, a fluorine-based or chlorine-based gas such as $CF_4$, $NF_3$, $Cl_2$, or $BCl_3$ is used, and an inert gas such as He or Ar may be added, as appropriate. In addition, when etching processing using atmospheric pressure discharge is applied, processing using local discharge can be performed, and it is not necessary to form a mask layer over an entire surface of the substrate.

In this embodiment mode, patterning is performed so that the island-shaped single-crystal semiconductor layer 230 becomes smaller than the island-shaped single-crystal semiconductor layer 210. The pattering is performed in such a manner in order to appropriately form contact between the island-shaped single-crystal semiconductor layer 210 and a wiring in forming a wiring (or an electrode) in a later step. However, the present invention is not limited thereto as long as a contact between the island-shaped single-crystal semiconductor layer 210 and the wiring can be appropriately formed.

After the island-shaped single-crystal semiconductor layer 230 is formed by patterning the single-crystal semiconductor layer 228, a p-type impurity such as boron, aluminum, or gallium may be added in order to control a threshold voltage. For example, as a p-type impurity, boron can be added at a concentration greater than or equal to $1\times10^{16}$ cm$^{-3}$ and less than or equal to $1\times10^{18}$ cm$^{-3}$. When a single-crystal semiconductor substrate with an impurity at appropriate concentration is used, a doping step for controlling a threshold voltage can be omitted.

Figure 6A:
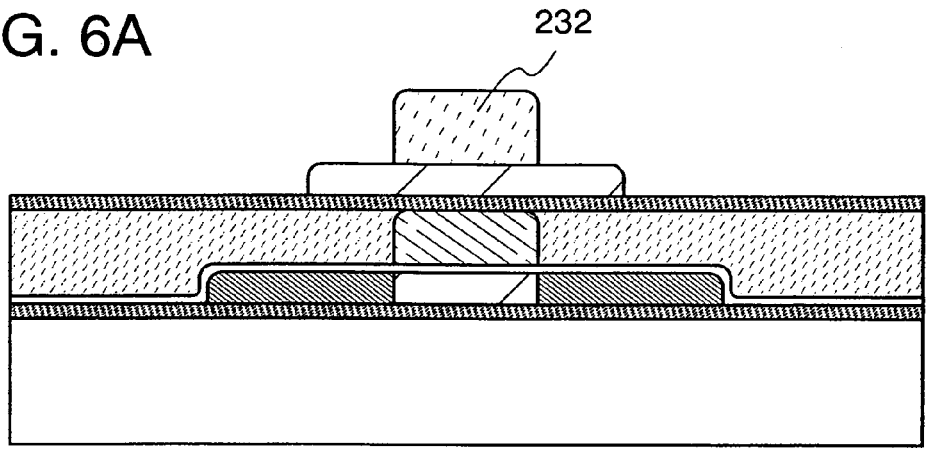
FIGS. 6A to 6C are diagrams showing a manufacturing process of a semiconductor device of the present invention.

Next, a mask 232 made of a resist material is formed over the island-shaped single-crystal semiconductor layer 230 by a photolithography method (see FIG. 6A). The mask 232 may be formed in a self-aligned manner by exposing a rear surface to light using the conductive layer 214 as a mask, or may be formed by exposing an upper surface to light using a metal mask. In the case where the mask 232 is formed in a self-aligned manner by exposing a rear surface to light, it is preferable to use light having such a wavelength as to be sufficiently transmitted through the single-crystal semiconductor layer and the insulating layer. For example, g line (wavelength: 436 nm) emitted from a high-pressure mercury lamp, or the like can be used.

Figure 6B:
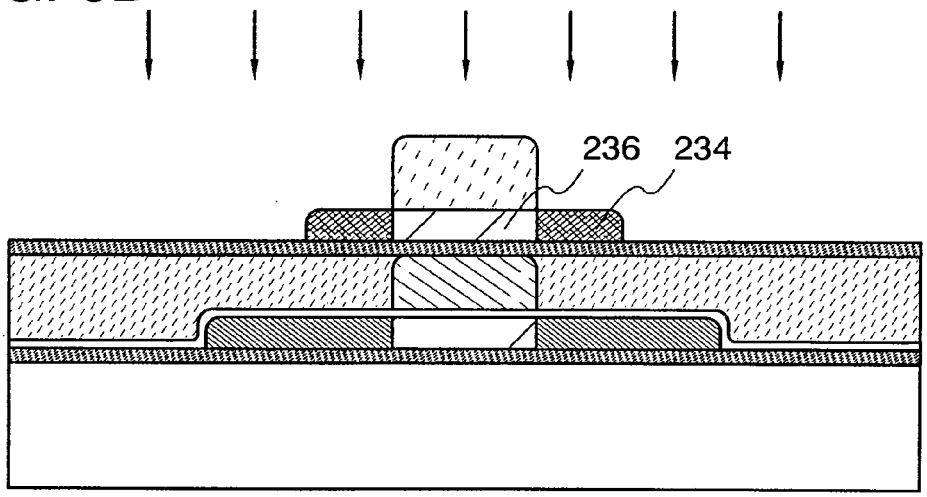

Then, an impurity element imparting p-type conductivity is added using the mask 232 to form an impurity region 234 and a channel formation region 236 (see FIG. 6B). In this embodiment mode, doping is performed using diborane (B$_2$H$_6$) as a doping gas containing an impurity element. Here, boron (B) is made to contain in the impurity region 234 at a concentration approximately greater than or equal to $1\times10^{20}$/cm$^3$ and less than or equal to $5\times10^{21}$/cm$^3$.

An impurity element imparting p-type conductivity is added to the island-shaped single-crystal semiconductor layer 230 in this embodiment mode. However, the present invention is not limited thereto, and an impurity element imparting n-type conductivity may alternatively be added. Further, an LDD region may be formed between the impurity region 234 and the channel formation region 236.

Figure 6C:
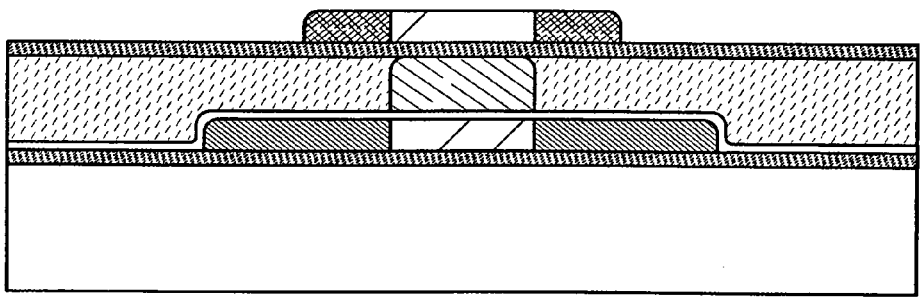

Then, the mask 232 is removed (see FIG. 6C). After the mask 232 is removed, heat treatment for activating the impurity region 234, or the like may be performed. Through the above-described steps, the island-shaped single-crystal semiconductor layer 230, the bonding layer 222 (insulating layer), and the conductive layer 214 are formed, which are included in the second transistor.

Figure 7A:
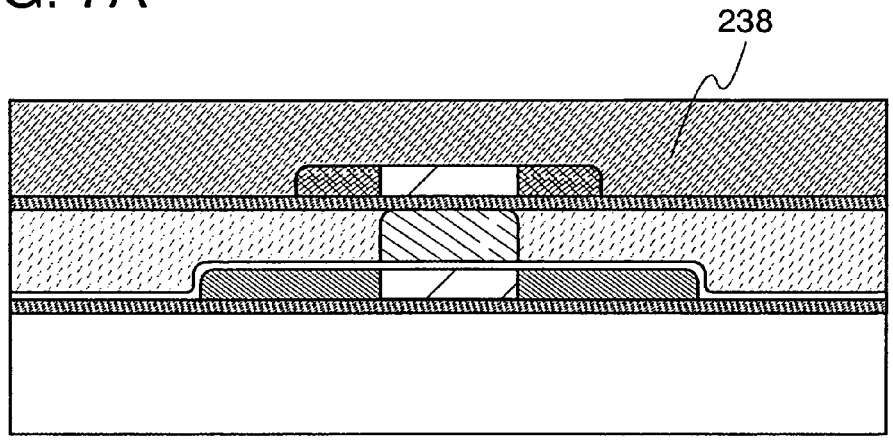
FIGS. 7A to 7C are diagrams showing a manufacturing process of a semiconductor device of the present invention.

Next, an insulating layer 238 is formed so as to cover the island-shaped single-crystal semiconductor layer 230 and the bonding layer 222 (see FIG. 7A). The insulating layer 238 can be formed by a sputtering method, an evaporation method, a CVD method, a coating method, or the like. The insulating layer 238 may be formed from an oxide material or a nitride material of silicon which is typified by silicon nitride, silicon oxide, silicon oxynitride, or silicon nitride oxide; or the like. Further, for the insulating layer 238, a material selected from aluminum oxide, aluminum nitride, aluminum oxynitride, aluminum nitride oxide which contains more nitrogen than oxygen, diamond-like carbon (DLC), carbon containing nitrogen, or other substances containing an inorganic insulating material may be used. Alternatively, a siloxane resin may be used. Note that a siloxane resin is a resin including a Si—O—Si bond. Siloxane is composed of a skeleton formed by the bond of silicon (Si) and oxygen (O), in which an organic group containing at least hydrogen (such as an alkyl group and aromatic hydrocarbon) is used as a substituent. Alternatively, a fluoro group may be included in the organic group. Further, an organic insulating material such as polyimide, acrylic, polyamide, polyimide amide, benzocyclobutene, or polysilazane may be used.

Figure 7B:
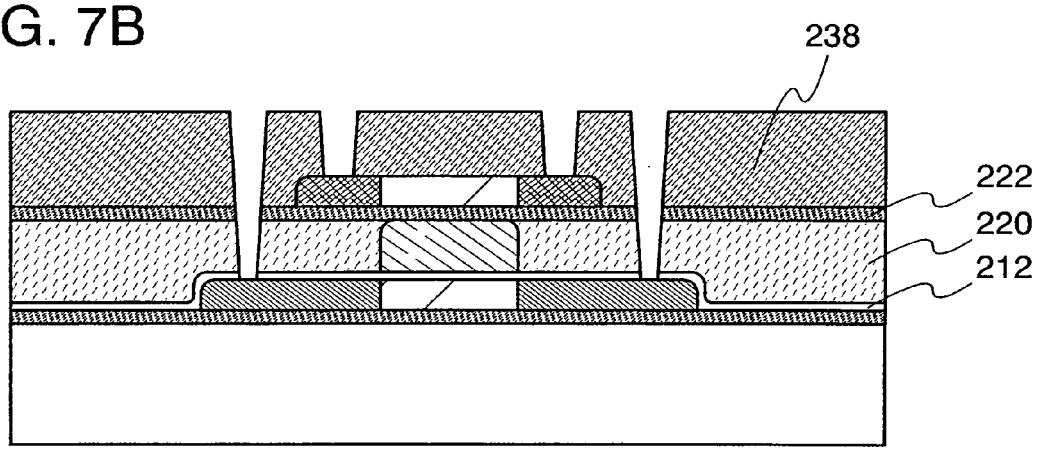

Next, contact holes (openings) are formed in the insulating layer 212, the insulating layer 220, the bonding layer 222, and the insulating layer 238; or in the insulating layer 238, using a mask made of a resist material (see FIG. 7B). Etching may be performed once or plural times depending on the selectivity of a material to be used.

Then, a conductive layer is formed so as to cover the openings, and the conductive layer is etched. Accordingly, source or drain electrodes (also referred to as source or drain wirings) 240, 242, and 244 which are electrically connected to part of their respective source or drain regions are formed (see FIG. 7C). The source or drain electrode can be formed using one or a plurality of elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), nickel (Ni), zinc (Zn), niobium (Nb), silicon (Si), phosphorus (P), boron (B), arsenic (As), gallium (Ga), indium (In), or tin (Sn); a compound or an alloy material containing any of the above elements as its component (for example, indium tin oxide (ITO), indium zinc oxide (IZO), indium tin oxide to which silicon oxide is added (ITSO), zinc oxide (ZnO), aluminum-neodymium (Al—Nd), magnesium-silver (Mg—Ag), or the like); a substance that is a combination of any of these compounds; or the like. Alternatively, a silicide (for example, aluminum-silicon, molybdenum-silicon, or nickel silicide), a nitrogen-containing compound (for example, titanium nitride, tantalum nitride, or molybdenum nitride), silicon (Si) that is doped with an impurity element such as phosphorus (P), or the like can be used.

Figure 7C:
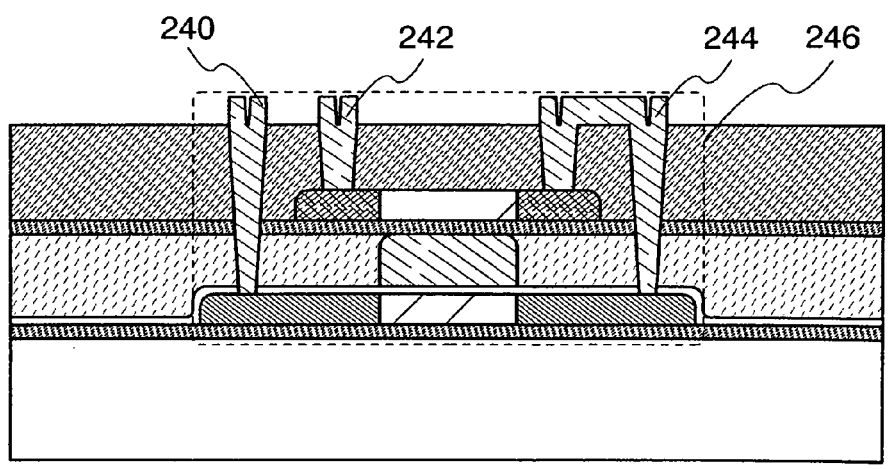

Through the above-described steps, a complementary circuit (a CMOS circuit) 246 including the first transistor and the second transistor is formed (see FIG. 7C). Note that in this embodiment mode, the first transistor is made to have n-type conductivity and the second transistor is made to have p-type conductivity. However, the present invention is not limited thereto, and the first transistor may be made to have p-type conductivity and the second transistor may be made to have n-type conductivity. Further, the complementary circuit 246 is not necessarily formed using two transistors having different polarities, and may be formed by stacking transistors having the same polarity. In the case where the first transistor and the second transistor have the same polarity, a conductive layer serving as a gate electrode may be independently provided in each transistor or may be shared in common. For example, the injection rate of an impurity element to the channel formation region of the first transistor is made different from that of the second transistor, so that the two transistors, a gate electrode of which is shared in common, can be independently operated.

Figure 19A:
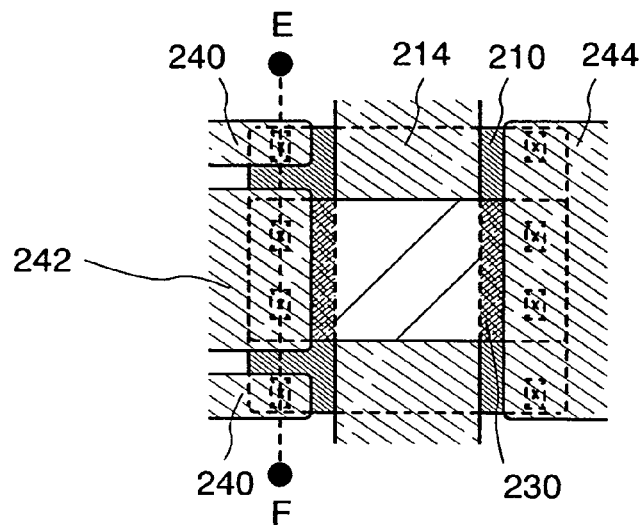
FIGS. 19A and 19B are diagrams showing an example of a semiconductor device of the present invention.
Figure 19B:
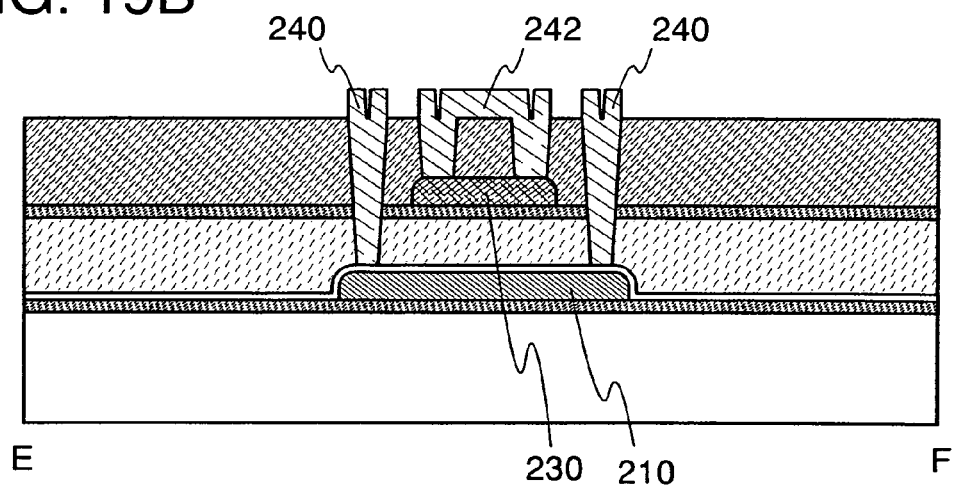

Note that this embodiment mode employs a structure in which the island-shaped single-crystal semiconductor layer 210 which forms the first transistor is different from the island-shaped single-crystal semiconductor layer 230 which forms the second transistor, in size in a channel length direction. However, for example, the island-shaped single-crystal semiconductor layer 210 may be different from the island-shaped single-crystal semiconductor layer 230, in size in a channel width direction as in a structure shown in FIGS. 19A and 19B. Here, FIG. 19A is a plan view and FIG. 19B is a cross-sectional view taken along line E-F in FIG. 19A. The source or drain electrode 240 (also referred to as the source or drain wiring), the source or drain electrode 242, and the source or drain electrode 244 in FIGS. 19A and 19B correspond to that in FIGS. 7A to 7C, and two transistors are electrically connected to each other by the source or drain electrode 244. Further, the conductive layer 214 serving as a gate electrode is provided in a manner similar to FIGS. 7A to 7C. Note that the conductive layer 214 serving as a gate electrode corresponds to an input terminal of a CMOS circuit, the source or drain electrode 244 corresponds to an output terminal of the CMOS circuit. As shown in FIGS. 19A and 19B, the channel width ($W_1$) of the first transistor (the transistor in the lower layer) is larger than the channel width ($W_2$) of the second transistor (the transistor in the upper layer).

In the case where a complementary circuit is formed as described above, the first transistor is made to have p-type conductivity and the second transistor is made to have n-type conductivity, whereby difference between the two transistors in mobility can be complemented. That is, when the channel width of a p-channel transistor with low mobility is larger than the channel width of an n-channel transistor with high mobility, the amount of current flowing through the p-channel transistor can be comparatively increased. Thus, high-speed operation of the complementary circuit can be realized as well as improvement in efficiency of layout. It is needless to say that the present invention is not limited to the above-described structure, and the channel width of the first transistor and the channel width of the second transistor can be appropriately changed according to required current or the like.

According to the present invention, a semiconductor element (for example, a transistor) is formed by stacking single-crystal semiconductor layers, whereby a highly-integrated semiconductor device can be manufactured without depending on making a process rule fine. That is, a small-sized semiconductor device having high performance can be provided. Further, various kinds of problems due to a finer process rule can be solved. Furthermore, since all semiconductor elements are formed using a single-crystal semiconductor, a semiconductor device with excellent characteristics can be provided as compared to the case of using an amorphous semiconductor or a polycrystalline semiconductor.

Further, in the present invention, a conductive layer for applying an electric field to a single-crystal semiconductor layer (the conductive layer is a so-called gate electrode) is shared in common. According to this, it is not necessary to form a plurality of conductive layers; thus, a semiconductor device can be manufactured at low cost. In particular, in the case of forming a complementary circuit (also referred to as a CMOS circuit or a complementary semiconductor device), a considerable merit is obtained. For example, in the case where complementary circuits are used for all circuits formed using two single-crystal semiconductor layers, an integration degree can be obtained, which is twice as large as that in the case of forming complementary circuits using one semiconductor layer as in a conventional one. Further, since the most part of the gate electrode is shared in common, extremely-low cost can be achieved. Furthermore, since a wiring is shared in common, the length of a wiring in the entire circuit can be decreased. That is, power consumption due to a wiring capacitor can be reduced; thus, the present invention enormously contributes to a reduction in power consumption.

It is needless to say that further integration can be easily realized by a multi-layer structure including three or more layers. Also in this case, a multi-layer semiconductor structure can be realized with reference to the manufacturing method described in this embodiment mode.

Embodiment Mode 2

This embodiment mode describes another example of a method for manufacturing a semiconductor device of the present invention, with reference to FIGS. 8A to 8D, FIGS. 9A to 9D, FIGS. 10A to 10C, FIGS. 11A to 11C, FIGS. 12A to 12C, and FIGS. 13A to 13C. Note that in this embodiment mode, the detailed description where Embodiment Mode 1 can be referred to is omitted.

First, a single-crystal semiconductor substrate 800 is prepared. Ions are introduced to a predetermined depth from a surface of the single-crystal semiconductor substrate 800 to form a damaged region 802 and a single-crystal semiconductor layer 804 (see FIG. 8A). The detailed description on a method for forming the damaged region 802 and the single-crystal semiconductor layer 804 is omitted here, because Embodiment Mode 1 can be referred to.

The single-crystal semiconductor substrate 800 is not particularly limited as long as it is a substrate made of a single-crystal semiconductor material. In this embodiment mode, a single-crystal silicon substrate is used as an example. Alternatively, a substrate made of germanium or a substrate made of a compound semiconductor such as gallium arsenide or indium phosphide may be used.

Note that a protective layer may be formed over the surface of the single-crystal semiconductor substrate 800 before the damaged region 802 is formed. By forming the protective layer, roughness of the surface of the single-crystal semiconductor substrate, which accompanies ion irradiation, can be reduced. For the protective layer, silicon oxide, silicon nitride, silicon nitride oxide, silicon oxynitride, or the like can be used.

Figure 8A:
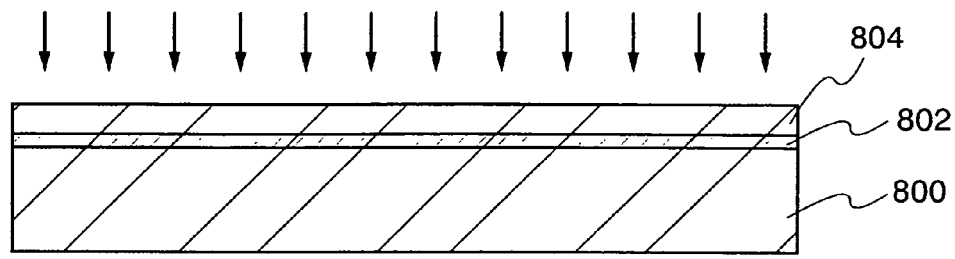
FIGS. 8A to 8D are diagrams showing a manufacturing process of a semiconductor device of the present invention.
Figure 8B:
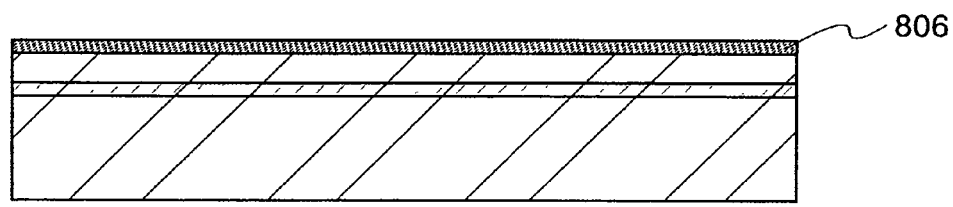

Next, a bonding layer 806 is formed over the single-crystal semiconductor layer 804 (see FIG. 8B). For the bonding layer 806, a silicon oxide film may be formed by a chemical vapor deposition (CVD) method using an organosilane gas. Alternatively, a silicon oxide film formed by a chemical vapor deposition method using a silane gas can be used. The bonding layer 806 can be referred to as an insulating layer because the bonding layer 806 is formed from an insulating material. The detail description on the bonding layer 806 is omitted here, because Embodiment Mode 1 can be referred to.

Note that a base layer may be provided between the single-crystal semiconductor layer 804 and the bonding layer 806. The base layer may be formed using one or a plurality of materials selected from silicon nitride, silicon nitride oxide, or silicon oxynitride. Note that the base layer may have a single-layer structure or a stacked-layer structure. The barrier layer is provided to prevent impurities such as movable ions or moisture from intruding into the single-crystal semiconductor layer 804. Note that the base layer may be formed from a material other than the above-described material as long as intrusion of impurities can be prevented. If intrusion of impurities does not lead to any significant problems, a structure without a base layer may be employed. When the protective layer is formed in the above, the protective layer may be used as a base layer.

Figure 8C:
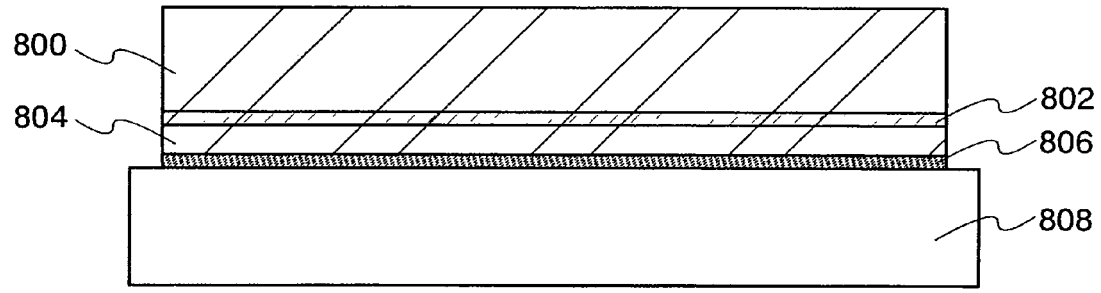

Next, a substrate 808 having an insulating surface and the bonding layer 806 are disposed in close contact with each other (see FIG. 8C). The substrate 808 having an insulating surface and the bonding layer 806 are disposed in close contact with each other and pressure is applied thereto, so that a strong bond can be formed by hydrogen bonds and covalent bonds. Note that it is preferable to perform heat treatment after the substrate 808 having an insulating surface and the single-crystal semiconductor substrate 800 are bonded to each other, with the bonding layer 806 interposed therebetween. The bonding strength can be further improved by performing heat treatment. Note that a barrier layer may be formed between the substrate 808 having an insulating surface and the bonding layer 806. By forming the barrier layer, movable ions or the like can be prevented from intruding into the single-crystal semiconductor layer 804. The barrier layer can be manufactured using a material similar to the base layer; however, the present invention is not limited thereto.

As the substrate 808 having an insulating surface, any of a variety of glass substrates which are used in the electronics industry such as an aluminosilicate glass substrate, an aluminoborosilicate glass substrate, and a barium borosilicate glass substrate; a quartz substrate; a ceramic substrate; a sapphire substrate; or the like can be used. A glass substrate is preferably used, and a mother glass substrate having a large area can be used, such as a so-called sixth generation substrate (1500 mm×1850 mm), a so-called seventh generation substrate (1870 mm×2200 mm), and a so-called eighth generation substrate (2200 mm×2400 mm), for example. A mother glass substrate having a large area is used as the substrate 808 having an insulating surface, so that the area of the semiconductor substrate can be enlarged. Note that the substrate 808 having an insulating surface is not limited to the above-described substrates. For example, a substrate made from a resin material can also be used if an upper temperature limit permits.

In order to form a favorable bond, the surface which is to form a bond may be activated. For example, the surface which is to form a bond is irradiated with an atomic beam or an ion beam. When an atomic beam or an ion beam is used, an inert gas atomic beam or inert gas ion beam of argon or the like can be used. Alternatively, plasma treatment or radical treatment is performed. Such surface treatment makes it possible to form a bond between different kinds of materials at a low temperature of approximately from 200 to 400° C.

Figure 8D:
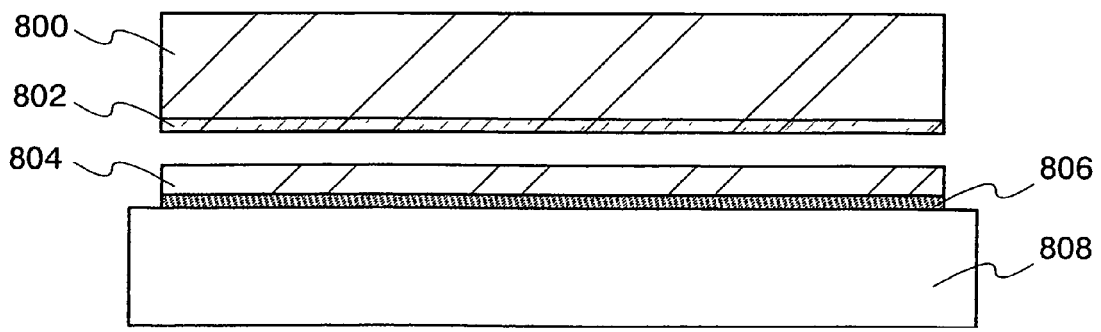

Next, heat treatment is performed to separate the single-crystal semiconductor layer 804 from the single-crystal semiconductor substrate 800 using part of the damaged region 802 as a separation plane (see FIG. 8D). For example, heat treatment at 400 to 600° C. is performed, so that the single-crystal semiconductor layer 804 can be separated by inducing the volume change of the microvoids which are formed in the damaged region 802. Since the bonding layer 806 is bonded to the substrate 808 having an insulating surface, the single-crystal semiconductor layer 804 is to remain over the substrate 808 having an insulating surface. In FIGS. 8A to 8D, separation is performed at the interface between the damaged region 802 and the single-crystal semiconductor layer 804; however, the present invention is not limited thereto. For example, separation may be performed at the interface between the damaged region 802 and the single-crystal semiconductor substrate 800 or may be performed in part of the damaged region 802. It is likely that regions where separation occurs are different depending on conditions in forming the damaged region 802.

The detailed description on other conditions is omitted here, because Embodiment Mode 1 can be referred to.

Figure 9A:
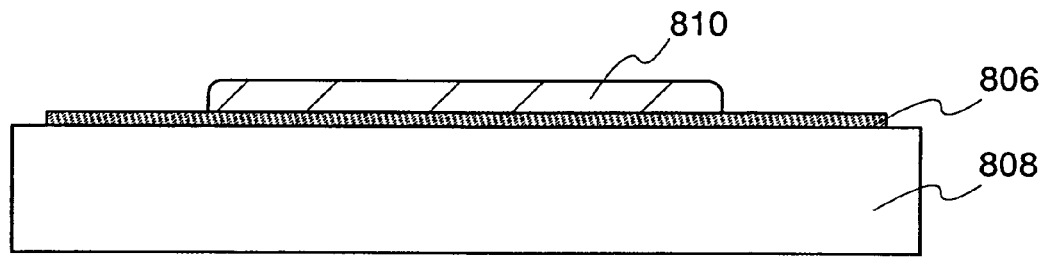
FIGS. 9A to 9D are diagrams showing a manufacturing process of a semiconductor device of the present invention.

Next, the single-crystal semiconductor layer 804 is patterned into a desired shape to form an island-shaped single-crystal semiconductor layer 810 (see FIG. 9A). As to an etching process in the patterning, either plasma etching (dry etching) or wet etching may be employed. In a case of processing a large-sized substrate, plasma etching is suitable. As to an etching gas, a fluorine-based or chlorine-based gas such as $CF_4$, $NF_3$, $Cl_2$, or $BCl_3$ is used, and an inert gas such as He or Ar may be added, as appropriate. In addition, when etching processing using atmospheric pressure discharge is applied, processing using local discharge can be locally performed, and it is not necessary to form a mask layer over an entire surface of the substrate.

After the island-shaped single-crystal semiconductor layer 810 is formed by patterning the single-crystal semiconductor layer 804, a p-type impurity such as boron, aluminum, or gallium may be added in order to control a threshold voltage. For example, as a p-type impurity, boron can be added at a concentration greater than or equal to $1\times10^{16}$ cm$^{-3}$ and less than or equal to $1\times10^{18}$ cm$^{-3}$. When a single-crystal semiconductor substrate with an impurity at appropriate concentration is used, a doping step for controlling threshold voltage can be omitted.

Figure 9B:
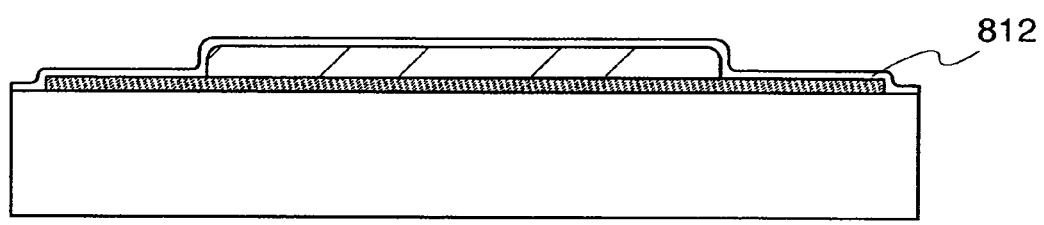

Next, an insulating layer 812 which covers the island-shaped single-crystal semiconductor layer 810 is formed (see FIG. 9B). The insulating layer 812 serves as a gate insulating layer. The insulating layer 812 is formed of a silicon-containing insulating film by a sputtering method, a CVD method, or the like to have a thickness approximately greater than or equal to 2 nm and less than or equal to 150 nm. For the detailed description thereon, Embodiment Mode 1 can be referred to.

Figure 9C:
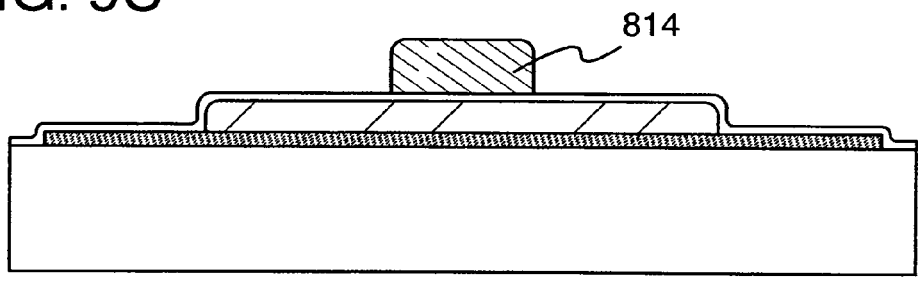

Next, a conductive layer is formed over the insulating layer 812, and the conductive layer is patterned to form a conductive layer 814 (see FIG. 9C). The conductive layer 814 serves as a gate electrode. For the detailed description thereon, Embodiment Mode 1 can be referred to.

Figure 9D:
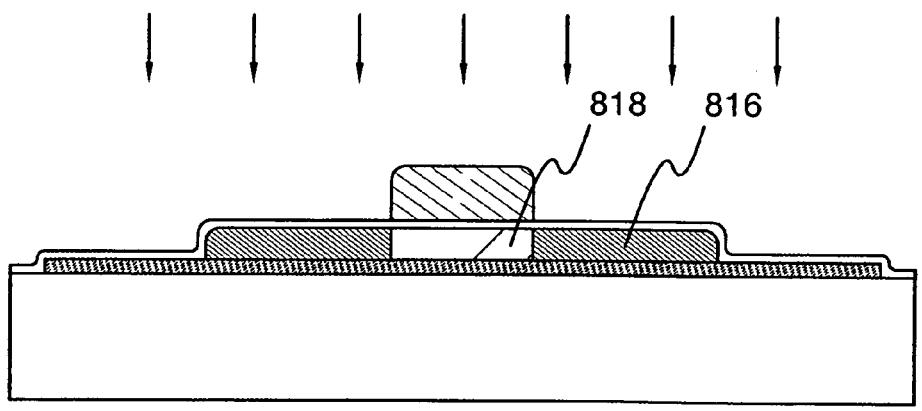

Next, an impurity element imparting n-type conductivity is added using the conductive layer 814 as a mask to form an impurity region 816 and a channel formation region 818 (see FIG. 9D). In this embodiment mode, doping is performed using phosphine ($PH_3$) as a doping gas containing an impurity element. Here, phosphorus (P) which is an impurity element imparting n-type conductivity is made to contain in the impurity region 816 at a concentration approximately greater than or equal to $1\times10^{19}$/cm$^3$ and less than or equal to $1\times10^{21}$/cm$^3$.

In this embodiment mode, an impurity element imparting n-type conductivity is added to the island-shaped single-crystal semiconductor layer 810. However, the present invention is not limited thereto, and an impurity element imparting p-type conductivity alternatively may be added. In the case of adding an impurity element imparting p-type conductivity, the concentration of an impurity element (for example, boron) is set to be approximately greater than or equal to $1\times10^{20}$/cm$^3$ and less than or equal to $5\times10^{21}$/cm$^3$. Further, an LDD region may be formed between the impurity region 816 and the channel formation region 818. It is preferable that the concentration of an impurity element in the LDD region be approximately greater than or equal to $1\times10^{17}$/cm$^3$ and less than or equal to $1\times10^{19}$/cm$^3$.

Through the above-described steps, the island-shaped single-crystal semiconductor layer 810, the insulating layer 812, and the conductive layer 814 are formed, which are included in a first transistor. Note that heat treatment or the like may be performed to activate the impurity region 816.

Figure 10A:
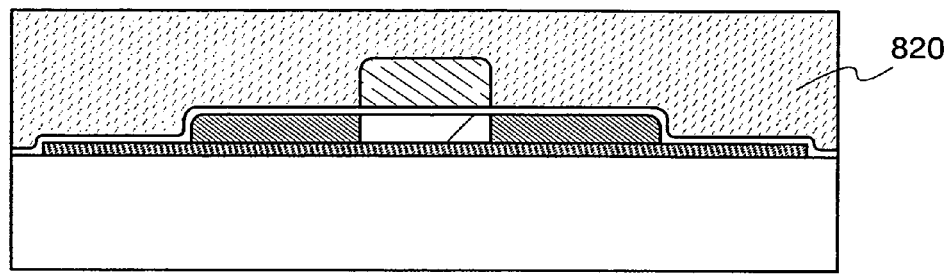
FIGS. 10A to 10C are diagrams showing a manufacturing process of a semiconductor device of the present invention.

Next, an insulating layer 820 is formed so as to cover the insulating layer 812 and the conductive layer 814 (see FIG. 10A). The insulating layer 812 can be formed by a sputtering method, an evaporation method, a CVD method, a coating method, or the like. For the detailed description thereon, Embodiment Mode 1 can be referred to.

The insulating layer 820 is formed to planarize a region to be bonded to the single-crystal semiconductor layer in a later step. Accordingly, in the case where unevenness due to the island-shaped single-crystal semiconductor layer 810, the insulating layer 812, and the conductive layer 814 is sufficiently small, a structure without the insulating layer 820 may be employed. However, even when little unevenness exists, a defect of bonding may occur. Therefore, the insulating layer 820 is preferably provided.

Figure 10B:
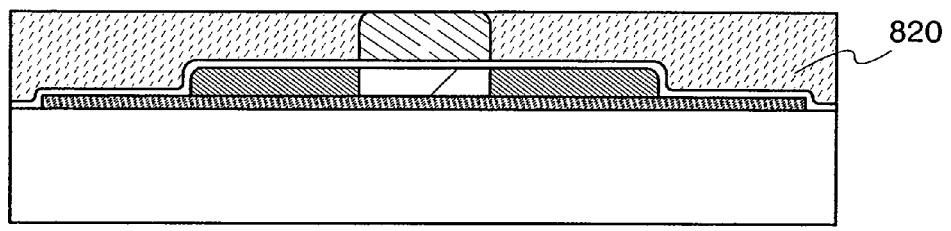
Figure 10C:
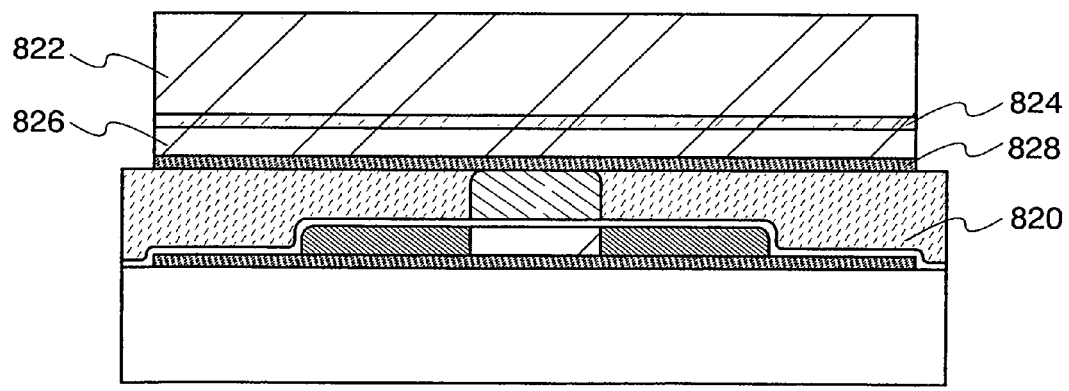

Next, an upper surface of the insulating layer 820 is planarized by a chemical mechanical polishing (CMP), laser beam irradiation, dry etching, or the like (see FIG. 10B).

More specifically, planarization may be performed to the extent that a surface of the conductive layer 814 is exposed. Accordingly, a defect in bonding the single-crystal semiconductor layer in a later step can be drastically reduced. Here, in the case where an upper surface of the insulating layer 820 is sufficiently planarized, a step of the planarizarion may be omitted. By planarization (polishing or the like) being performed to the extent that the surface of the conductive layer 814 is exposed, only a bonding layer to be formed in a later step can be used as a gate insulating layer. Since the bonding layer is an extremely dense film and can be formed to be sufficiently thin, the bonding layer is preferable as a gate insulating layer. Thus, a transistor formed using the bonding layer has excellent characteristics.

Next, ions are introduced to a predetermined depth from a surface of a single-crystal semiconductor substrate 822 to form a damaged region 824 and a single-crystal semiconductor layer 826. Further, a bonding layer 828 is formed over the single-crystal semiconductor layer 826. Subsequently, the bonding layer 828 and the insulating layer 820 (and the conductive layer 814) are disposed in close contact with each other (see FIG. 10C). The bonding layer 828 and the insulating layer 820 are disposed in close contact with each other and pressure is applied thereto, so that the bonding layer 828 and the insulating layer 820 can be bonded firmly to each other by hydrogen bonds and covalent bonds. Note that it is preferable to perform heat treatment after the bonding layer 828 and the insulating layer 820 are disposed in contact with each other. The bonding strength can be further improved by performing heat treatment. Further, a base layer may be formed between the single-crystal semiconductor layer 826 and the bonding layer 828. However, in the case where only the bonding layer 828 is used as a gate insulating layer, the base layer is not formed. In the case where the base layer is formed, the base layer may be formed from one or more materials selected from silicon nitride, silicon nitride oxide, or silicon oxynitride. Here, since the bonding layer 828 is formed from an insulating material, the bonding layer can be referred to as an insulating layer.

Figure 11A:
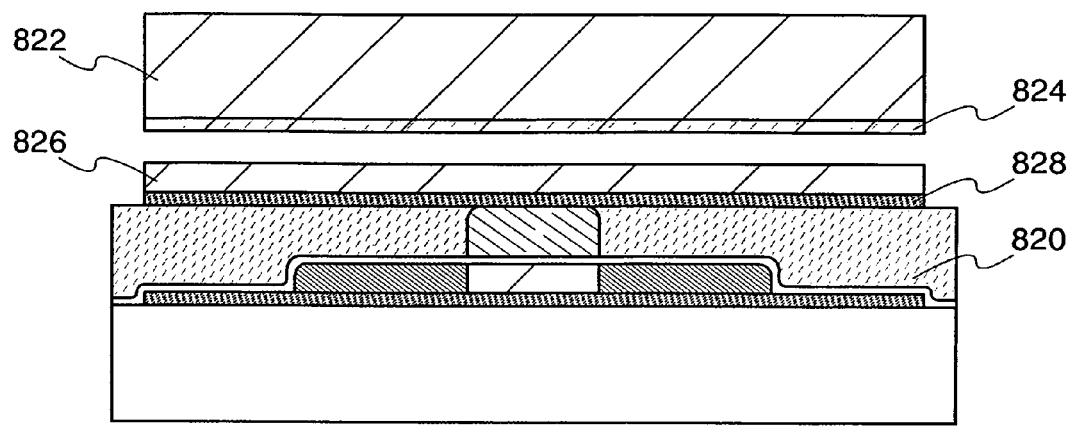
FIGS. 11A to 11C are diagrams showing a manufacturing process of a semiconductor device of the present invention.
Figure 11B:
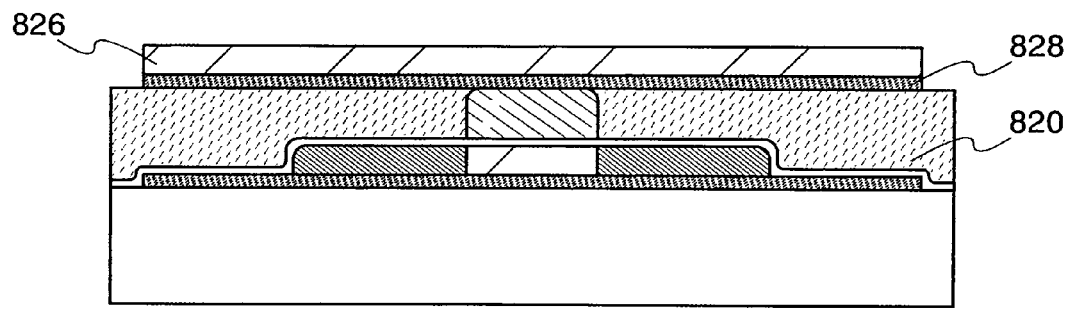
Figure 11C:
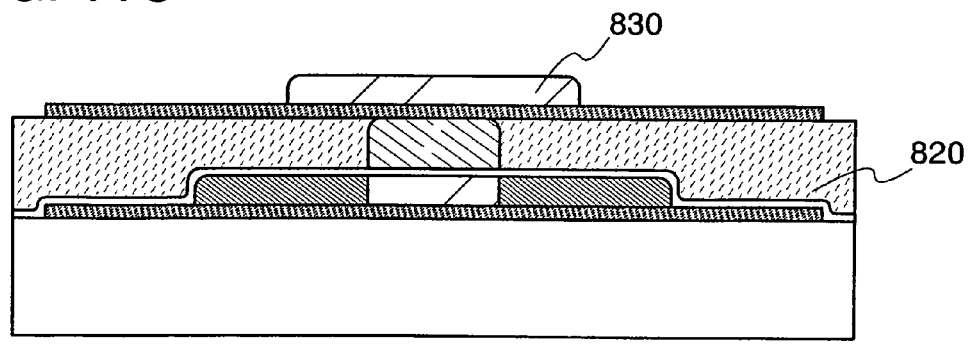

Next, heat treatment is performed to separate the single-crystal semiconductor layer 826 from the single-crystal semiconductor substrate 822 using part of the damaged region 824 as a separation plane (see FIG. 11A). For example, heat treatment at 400 to 600° C. is performed, so that the single-crystal semiconductor layer 826 can be separated by inducing the volume change of the microvoids which are formed in the damaged region 824. Accordingly, the single-crystal semiconductor layer 826 is to remain over the insulating layer 820. In FIGS. 11A to 11C, separation is performed at the interface between the damaged region 824 and the single-crystal semiconductor layer 826; however, the present invention is not limited thereto. For example, separation may be performed at the interface between the damaged region 824 and the single-crystal semiconductor substrate 822 or may be performed in part of the damaged region 824. It is likely that regions where separation occurs are different depending on conditions in forming the damaged region 824.

The description on detailed conditions or the like is omitted here, because Embodiment Mode 1 can be referred to. Through the above-described steps, the single-crystal semiconductor layer 826 can be formed over the insulating layer 820 (see FIG. 11B).

Next, the single-crystal semiconductor layer 826 is patterned into a desired shape to form an island-shaped single-crystal semiconductor layer 830 (see FIG. 11C). For the detailed description, Embodiment Mode 1 can be referred to.

After the island-shaped single-crystal semiconductor layer 830 is formed by patterning the single-crystal semiconductor layer 826, a p-type impurity such as boron, aluminum, or gallium may be added in order to control a threshold voltage. For example, as a p-type impurity, boron can be added at a concentration greater than or equal to $1 \times 10^{16}$ cm$^{-3}$ and less than or equal to $1 \times 10^{18}$ cm$^{-3}$. When a single-crystal semiconductor substrate with an impurity at appropriate concentration is used, a doping step for controlling a threshold voltage can be omitted.

Figure 12A:
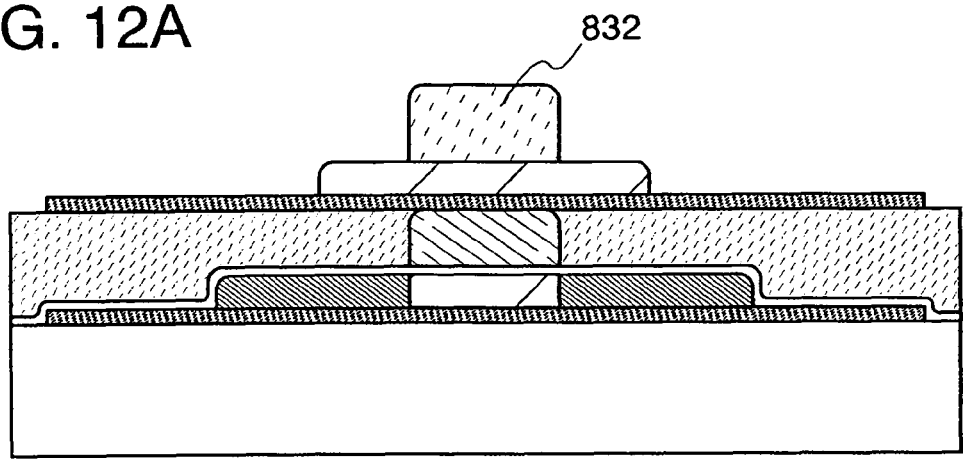
FIGS. 12A to 12C are diagrams showing a manufacturing process of a semiconductor device of the present invention.
Figure 12B:
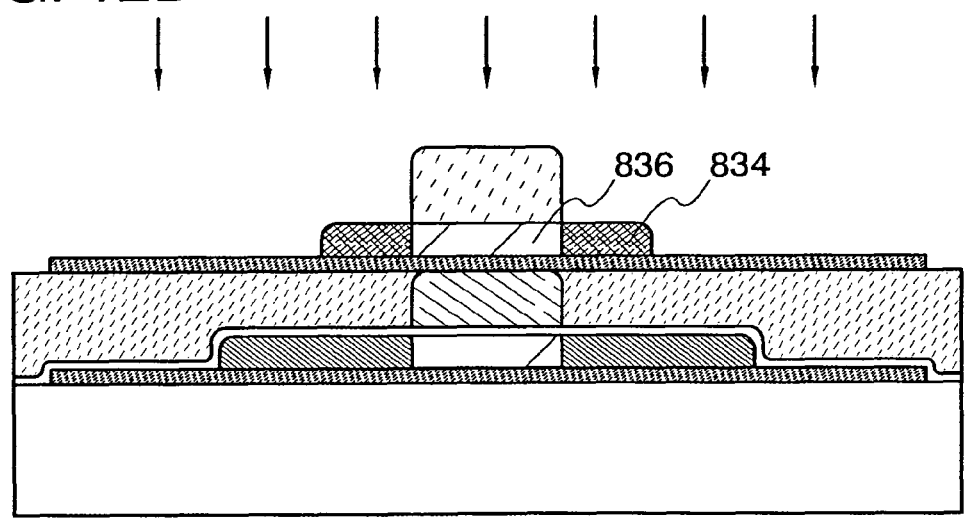

Next, a mask 832 made of a resist material is formed over the island-shaped single-crystal semiconductor layer 830 by a photolithography method (see FIG. 12A). Then, an impurity element imparting p-type conductivity is added using the mask 832 to form an impurity region 834 and a channel formation region 836 (see FIG. 12B). In this embodiment mode, doping is performed using diborane ($B_2H_6$) as a doping gas containing an impurity element. Here, boron (B) is made to contain in the impurity region 834 at a concentration approximately greater than or equal to $1 \times 10^{20}$/cm$^3$ and less than or equal to $5 \times 10^{21}$/cm$^3$.

An impurity element imparting p-type conductivity is added to the island-shaped single-crystal semiconductor layer 830 in this embodiment mode. However, the present invention is not limited thereto, and an impurity element imparting n-type conductivity may alternatively be added. Further, an LDD region may be formed between the impurity region 834 and the channel formation region 836.

Figure 12C:
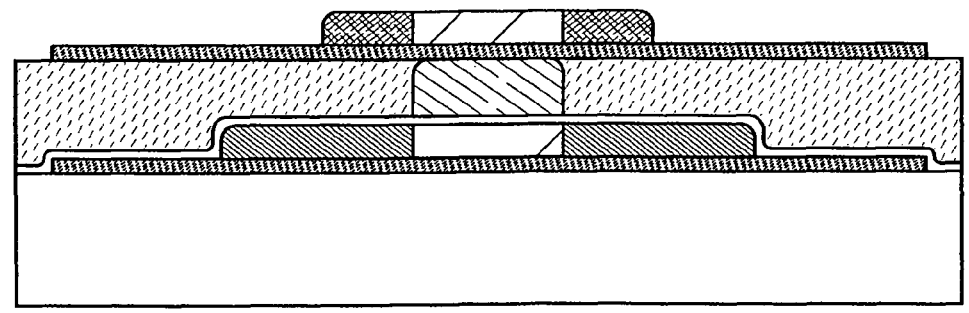

Then, the mask 832 is removed (see FIG. 12C). After the mask 832 is removed, heat treatment for activating the impurity region 834, or the like may be performed. Through the above-described steps, the island-shaped single-crystal semiconductor layer 830, the bonding layer 828 (insulating layer), and the conductive layer 814 are formed, which are included in a second transistor.

Figure 13A:
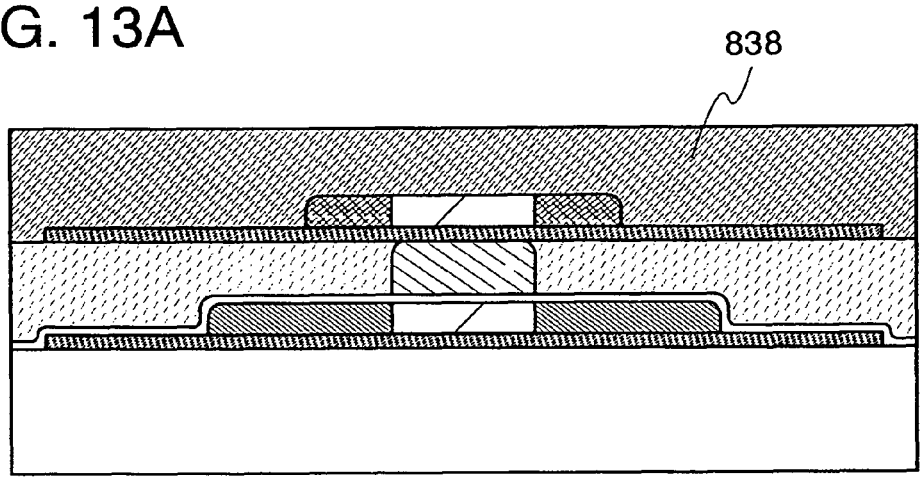
FIGS. 13A to 13C are diagrams showing a manufacturing process of a semiconductor device of the present invention.

Next, an insulating layer 838 is formed so as to cover the island-shaped single-crystal semiconductor layer 830 and the bonding layer 828 (FIG. 13A). For the detailed description thereon, Embodiment Mode 1 can be referred to.

Figure 13B:
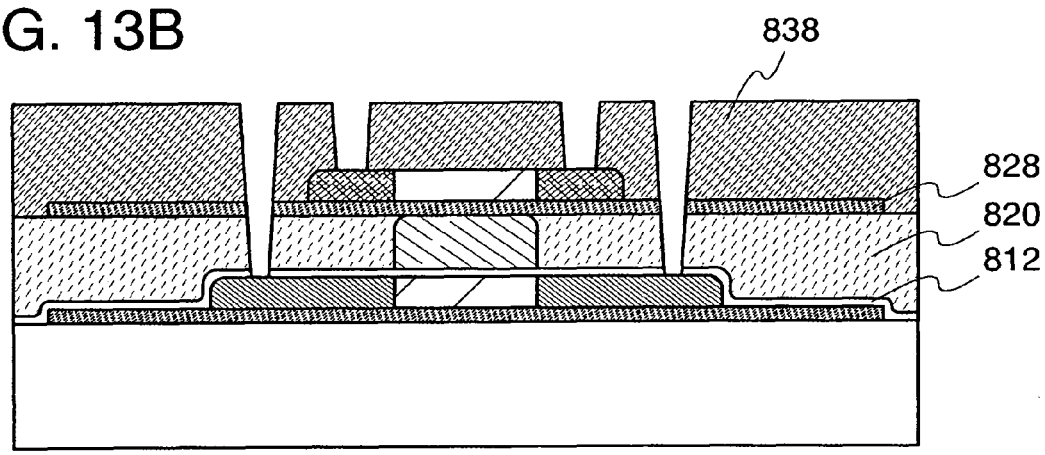

Next, contact holes (openings) are formed in the insulating layer 812, the insulating layer 820, the bonding layer 828, and the insulating layer 838; or in the insulating layer 838, using a mask made of a resist material (see FIG. 13B). Etching may be performed once or plural times depending on the selectivity of a material to be used.

Then, a conductive layer is formed so as to cover the openings, and the conductive layer is etched. Accordingly, source or drain electrodes (also referred to as source or drain wirings) 840, 842, and 844 which are electrically connected to part of their respective source or drain regions are formed (see FIG. 13C). For the detailed description thereon, Embodiment Mode 1 can be referred to.

Figure 13C:
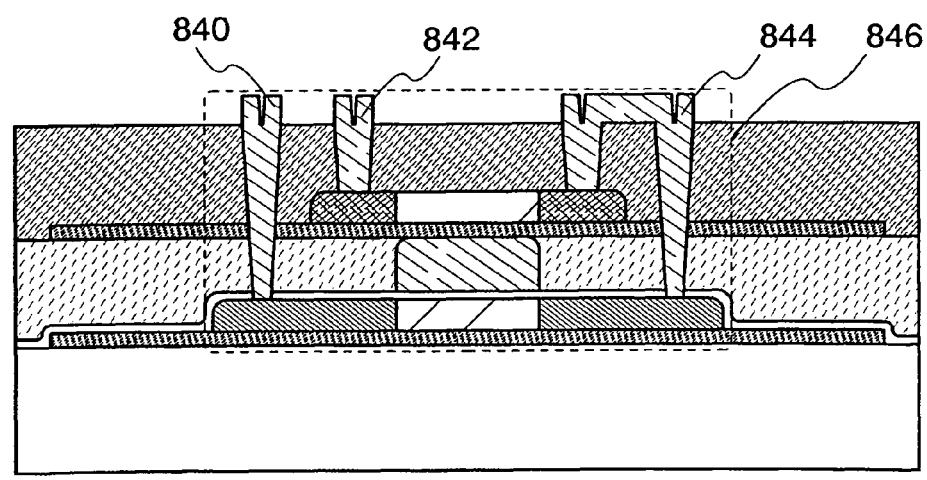

Through the above-described steps, a complementary circuit (a CMOS circuit) 846 including the first transistor and the second transistor is formed (see FIG. 13C). Note that in this embodiment mode, the first transistor is made to have n-type conductivity and the second transistor is made to have p-type conductivity. However, the present invention is not limited thereto, and the first transistor may be made to have p-type conductivity and the second transistor may be made to have n-type conductivity. Further, the complementary circuit 846 is not necessarily formed using two transistors of different polarities, and may be formed by stacking transistors having the same polarity.

This embodiment mode employs a structure in which the bonding layer is provided on the side of the single-crystal semiconductor substrate, unlike Embodiment Mode 1. However, the present invention is not limited thereto, and a structure may be used in which the bonding layer is provided on the side of the substrate having an insulating surface, like Embodiment Mode 1. Further, a structure may be used in which the bonding layer in forming the single-crystal semiconductor layer of the first transistor is formed on the side of the substrate having an insulating surface, and the bonding layer in forming the single-crystal semiconductor layer of the second transistor is formed on the side of the single-crystal semiconductor substrate. It is needless to say that a structure may alternatively be used in which the bonding layer in forming the single-crystal semiconductor layer of the first transistor is formed on the side of the single-crystal semiconductor substrate, and the bonding layer in forming the single-crystal semiconductor layer of the second transistor is formed on the side of the substrate having an insulating surface.

According to the present invention, a semiconductor element (for example, a transistor) can be formed by stacking single-crystal semiconductor layers, whereby a highly-integrated semiconductor device can be manufactured without depending on making a process rule fine. That is, various kinds of problems due to a finer process rule can be solved. Further, since all semiconductor elements are formed using a single-crystal semiconductor, a semiconductor device with excellent characteristics can be provided as compared to the case of using an amorphous semiconductor or a polycrystalline semiconductor.

Further, in the present invention, a conductive layer for applying an electric field to a single-crystal semiconductor layer (the conductive layer is a so-called gate electrode) is shared in common. According to this, it is not necessary to form a plurality of conductive layers; thus, a semiconductor device can be manufactured at low cost. In particular, in the case of forming a complementary circuit (also referred to as a CMOS circuit or a complementary semiconductor device), a considerable merit is obtained. For example, in the case where complementary circuits are used for all circuits formed using two single-crystal semiconductor layers, an integration degree can be obtained, which is twice as large as that in the case of forming complementary circuits using one semiconductor layer as in a conventional one. Further, since the most part of the gate electrode is shared in common, extremely-low cost can be achieved.

It is needless to say that further integration can be easily realized by a multi-layer structure including three or more layers. Also in this case, a multi-layer semiconductor structure can be realized with reference to the manufacturing method described in this embodiment mode.

This embodiment mode can be combined with Embodiment Mode 1, as appropriate.

Embodiment Mode 3

Figure 14A:
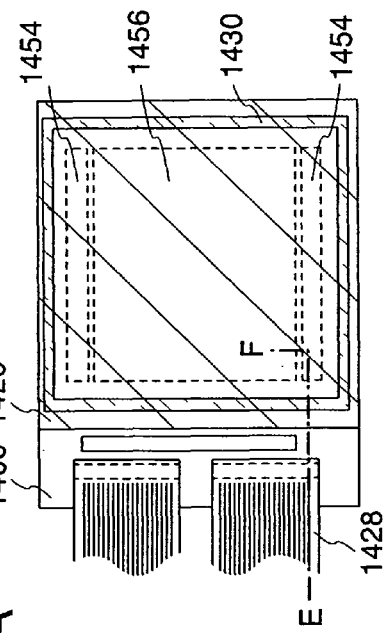
FIGS. 14A and 14B are diagrams showing an example of a semiconductor device of the present invention.
Figure 14B:
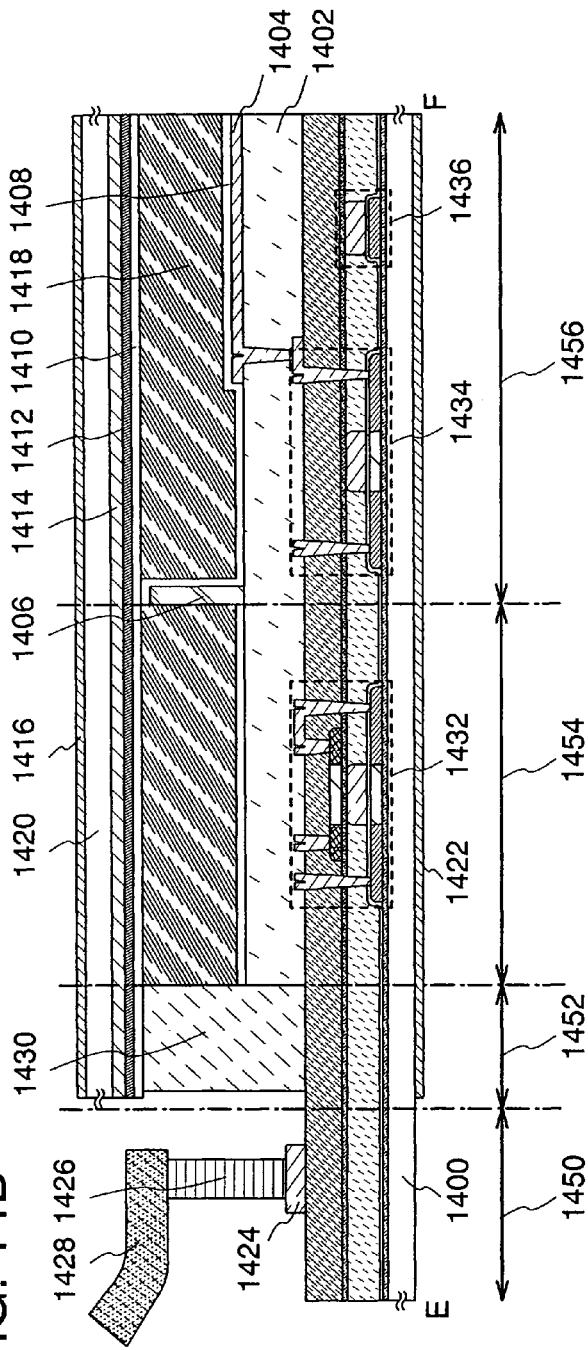

This embodiment mode will describe an example of a semiconductor device of the present invention, with reference to FIGS. 14A and 14B. Note that although description will be made by using a liquid crystal display device as an example of a semiconductor device in this embodiment mode, a semiconductor device which can be manufactured according to the present invention is not limited to a liquid crystal display device.

FIGS. 14A and 14B show an example of a liquid crystal display device of the present invention. FIG. 14A is a plan view of a liquid crystal display device, and FIG. 14B is a cross-sectional view taken along line E-F in FIG. 14A. The liquid crystal display device can be manufactured in the following manner: after a transistor is formed over a substrate 1400 having an insulating surface by using a method described in Embodiment Mode 1, Embodiment Mode 2, or the like, an interlayer insulating layer 1402, a pixel electrode 1404, a spacer 1406, an insulating layer 1408 serving as an alignment film, and the like are formed; a counter substrate 1420 provided with an insulating layer 1410 serving as an alignment film, a conductive layer 1412 serving as a counter electrode, a colored layer 1414 serving as a color filter, a polarizer 1416 (also referred to as a polarizing plate), and the like is attached to the substrate 1400; and a liquid crystal layer 1418 is provided in a space. Note that although the substrate 1400 having an insulating surface is provided with a polarizer 1422 (a polarizing plate), the present invention is not limited thereto. For example, a polarizer may be provided on one side in a reflective type liquid crystal display device.

The pixel electrode 1404 can be formed using indium tin oxide (ITO), indium zinc oxide (IZO) in which zinc oxide (ZnO) is mixed with indium oxide, a conductive material in which silicon oxide ($SiO_2$) is mixed with indium oxide, organic indium, organic tin, indium oxide containing tungsten oxide, indium zinc oxide containing tungsten oxide, indium oxide containing titanium oxide, indium tin oxide containing titanium oxide, a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag), an alloy thereof, or metal nitride thereof. A conductive composition containing a conductive macromolecule (also referred to as a conductive polymer) may also be used. A thin film of a conductive composition preferably has a sheet resistance of less than or equal to 10000 $\Omega$/square. When a thin film is formed as a pixel electrode layer having a light-transmitting property, light transmittance is preferably greater than or equal to 70% at a wavelength of 550 nm. Further, the resistivity of a conductive macromolecule which is contained in the thin film is preferably less than or equal to 0.1 $\Omega\cdot$cm.

The insulating layer 1408 serving as an alignment film and the insulating layer 1410 serving as an alignment film are subjected to rubbing treatment. Thus, alignment of liquid crystal molecules can be controlled.

The liquid crystal display device described in this embodiment mode includes an external terminal connection region 1450, a sealing region 1452, a driver circuit region 1454, and a pixel region 1456.

In the external terminal connection region 1450, an FPC 1428 is connected to a terminal electrode layer 1424 electrically connected to the pixel region 1456, with an anisotropic conductive layer 1426 interposed therebetween. The FPC 1428 has a function of transmitting a signal from the external. In the sealing region 1452, the substrate 1400 having an insulating surface and the counter substrate 1420 are sealed with a sealant 1430. In the driver circuit region 1454, a CMOS circuit 1432 including an n-channel transistor and a p-channel transistor is provided. In the pixel region 1456, an n-channel transistor 1434 and a capacitor wiring 1436 are formed. Note that the n-channel transistor 1434 in the pixel region 1456 can be manufactured in a manner similar to an n-channel transistor (a first transistor) of the CMOS circuit 1432. The capacitor wiring 1436 is formed in the same layer as a conductive layer which serves as a gate electrode in each transistor.

Although an n-channel transistor is used as a transistor in the pixel region 1456 in this embodiment mode, the present invention is not limited thereto. A p-channel transistor may be used as the transistor. In the case of using a p-channel transistor, the p-channel transistor can be manufactured in a manner similar to a p-channel transistor (a second transistor) of the CMOS circuit 1432.

Note that in the case where the transistor formed in the pixel region 1456 is not needed to be formed using a single-crystal semiconductor, the transistor may be alternatively manufactured using an amorphous semiconductor, a microcrystalline semiconductor, a polycrystalline semiconductor, or the like.

When the CMOS circuit 1432 is manufactured by stacking single-crystal semiconductor layers as in the present invention, an IC chip is not needed to be externally added. Thus, the thickness and the frame area of a semiconductor device can be reduced and a semiconductor device in which a pixel region is effectively utilized can be provided at low cost. In particular, since the CMOS circuit 1432 is provided using stacked layers, the area of a circuit can be reduced as compared to the case of forming a similar circuit using a single layer. That is, a frame region can be sufficiently small and the utilization of the pixel region can be maximized.

Although description is made by using a liquid crystal display device as an example of a liquid crystal display device in this embodiment mode, the present invention is not limited thereto. For example, an electroluminescent display device (also referred to as a light-emitting device or an EL display device), a display device using an electrophoresis element (also referred to as electronic paper or an electrophoresis display device), or the like may also be provided with a similar structure. This embodiment mode can be combined with any of Embodiment Modes 1 and 2, as appropriate.

Embodiment Mode 4

Figure 15:
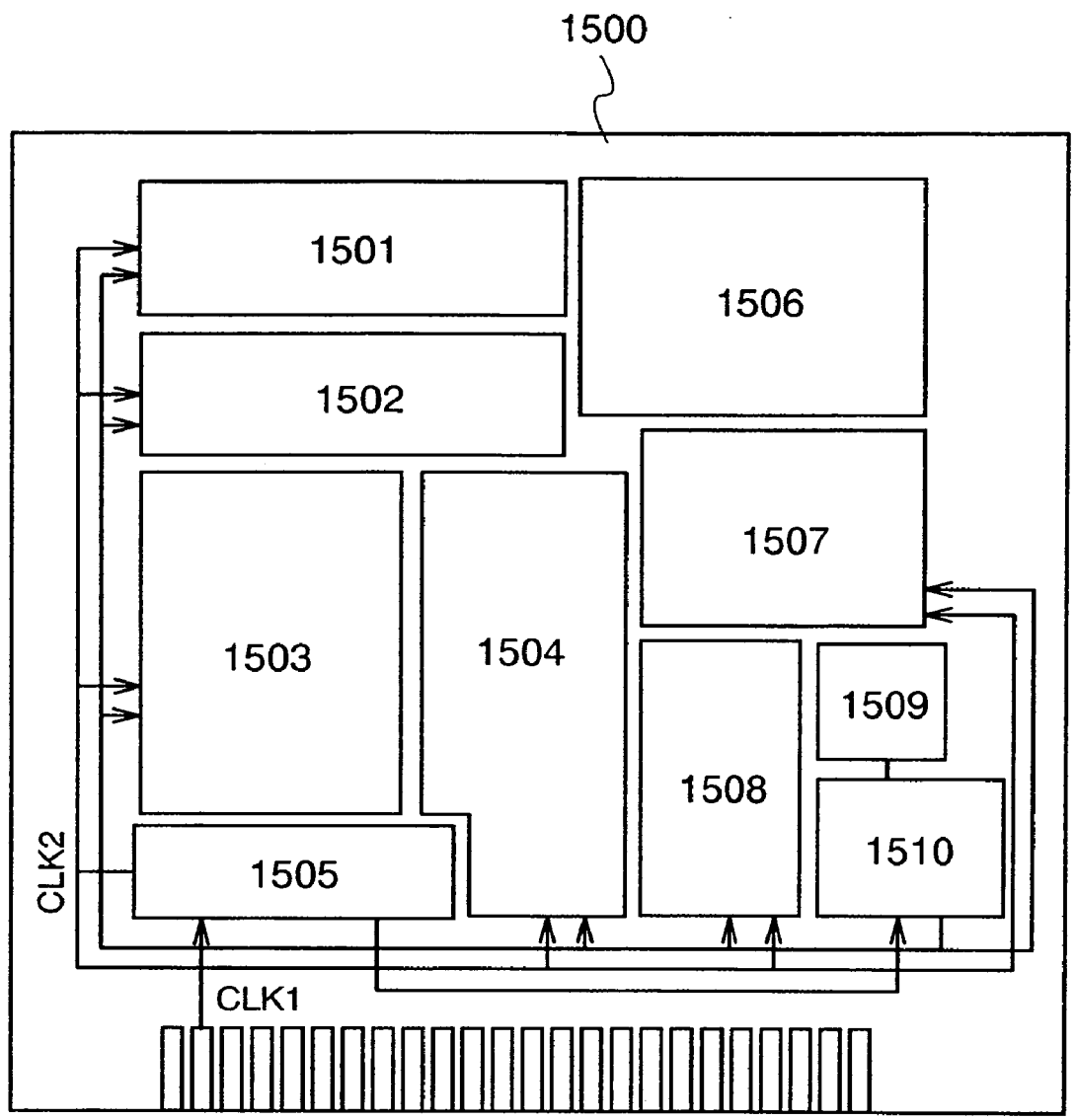
FIG. 15 is a diagram showing an example of a semiconductor device of the present invention.
Figure 16:
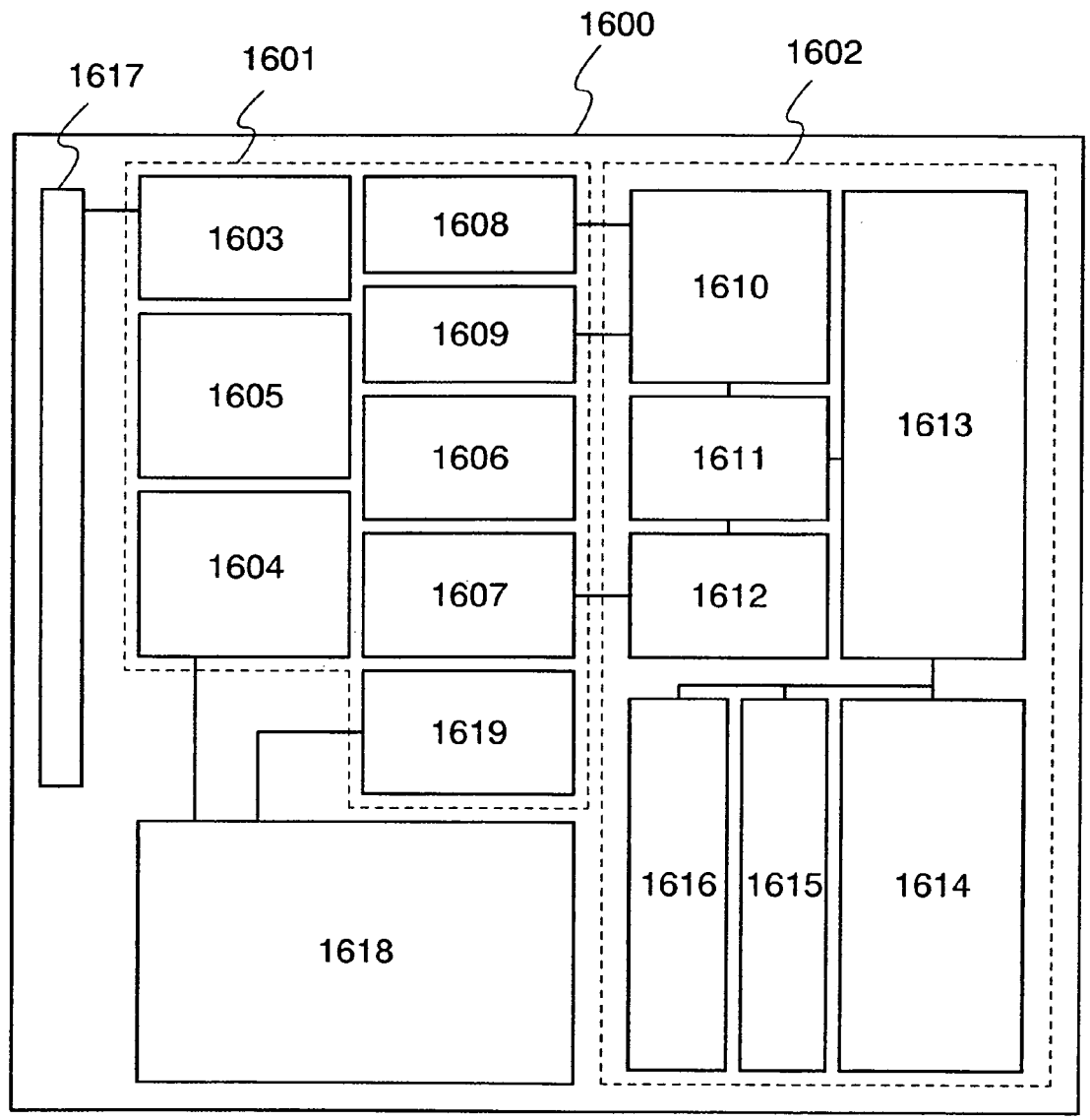
FIG. 16 is a diagram showing an example of a semiconductor device of the present invention.

This embodiment mode will describe another example of a semiconductor device related to the present invention, with reference to FIGS. 15 and 16. Note that a microprocessor and an electronic tag are given as examples in this embodiment mode; however, a semiconductor device of the present invention is not limited thereto.

FIG. 15 illustrates a structural example of a microprocessor of the present invention. A microprocessor 1500 illustrated in FIG. 15 is manufactured using the semiconductor substrate of the present invention. The microprocessor 1500 has an arithmetic logic unit (ALU) 1501, an ALU controller 1502, an instruction decoder 1503, an interrupt controller 1504, a timing controller 1505, a register 1506, a register controller 1507, a bus interface (Bus I/F) 1508, a read only memory (ROM) 1509, and a memory interface (ROM I/F) 1510.

An instruction inputted to the microprocessor 1500 via the bus interface 1508 is inputted to the instruction decoder 1503 and decoded. Then, the instruction is inputted to the ALU controller 1502, the interrupt controller 1504, the register controller 1507, and the timing controller 1505. The ALU controller 1502, the interrupt controller 1504, the register controller 1507, and the timing controller 1505 perform various controls based on the decoded instruction. Specifically, the ALU controller 1502 generates a signal for controlling the operation of the arithmetic logic unit 1501. The interrupt controller 1504 judges an interrupt request from an external input/output device or a peripheral circuit based on its priority or the like, and processes the request while a program is executed in the microprocessor 1500. The register controller 1507 generates an address of the register 1506, and reads/writes data from/to the register 1506 depending on the state of the microprocessor 1500. The timing controller 1505 generates signals for controlling timing of driving of the arithmetic logic unit 1501, the ALU controller 1502, the instruction decoder 1503, the interrupt controller 1504, and the register controller 1507. For example, the timing controller 1505 is provided with an internal clock generator for generating an internal clock signal CLK2 based on a reference clock signal CLK1, and supplies the clock signal CLK2 to each of the above-mentioned various circuits. Note that the structure of the microprocessor 1500 illustrated in FIG. 15 is just an example, and the structure can be changed, as appropriate, depending on usage.

Since an integrated circuit in the microprocessor 1500 of the present invention is formed using a single-crystal semiconductor layer whose crystals are oriented in a certain direction and which is bonded to a substrate having an insulating surface, higher processing speed and lower power consumption can be achieved. Further, in the microprocessor 1500 which is manufactured using the semiconductor substrate of the present invention, crystallinity, an activation rate, or the like of a single-crystal semiconductor layer is uniformed by laser light irradiation on the front surface and the back surface of the single-crystal semiconductor layer. Accordingly, characteristics of a semiconductor element are improved; thus, a microprocessor having extremely high performance and high reliability can be provided.

Next, an example of a semiconductor device which has an arithmetic function and can transmit and receive data without contact is described with reference to FIG. 16. FIG. 16 illustrates an example of a wireless tag which transmits and receives signals to/from an external device by wireless communication. Note that the wireless tag of the present invention includes a central processing unit (CPU), so to speak, a miniaturized computer. A wireless tag 1600 has an analog circuit portion 1601 and a digital circuit portion 1602. The analog circuit portion 1601 includes a resonance circuit 1603 having a resonant capacitor, a rectifier circuit 1604, a constant voltage circuit 1605, a reset circuit 1606, an oscillator circuit 1607, a demodulation circuit 1608, and a modulation circuit 1609. The digital circuit portion 1602 includes an RF interface 1610, a control register 1611, a clock controller 1612, an interface 1613, a central processing unit 1614, a random access memory 1615, and a read only memory 1616.

The operation of the wireless tag 1600 having such a structure is roughly described below. Induced electromotive force is generated by the resonance circuit 1603 when a signal is received by an antenna 1617. The induced electromotive force is stored in a capacitor portion 1618 via the rectifier circuit 1604. The capacitor portion 1618 is preferably formed using a capacitor such as a ceramic capacitor or an electric double layer capacitor. The capacitor portion 1618 may be formed over the same substrate as the wireless tag 1600 or may be attached, as another component, to a substrate having an insulating surface that is included in the wireless tag 1600.

The reset circuit 1606 generates a signal that resets the digital circuit portion 1602 to be initialized. For example, the reset circuit 1606 generates, as a reset signal, a signal that rises with delay after the power supply voltage is increased. The oscillator circuit 1607 changes the frequency and the duty ratio of a clock signal depending on a control signal generated by the constant voltage circuit 1605. The demodulation circuit 1608 having a low pass filter, for example, binarizes variations in amplitude of reception signals of an amplitude shift keying (ASK) system. The modulation circuit 1609 varies and transmits the amplitude of transmission signals of an amplitude shift keying (ASK) system. The modulation circuit 1609 varies the resonance point of the resonance circuit 1603, thereby varying the amplitude of communication signals. The clock controller 1612 generates a control signal for changing the frequency and the duty ratio of the clock signal depending on the power supply voltage or current consumption in the central processing unit 1614. The power supply voltage is monitored by a power supply control circuit 1619.

A signal that is inputted to the wireless tag 1600 from the antenna 1617 is demodulated by the demodulation circuit 1608, and then divided into a control command, data, and the like by the RF interface 1610. The control command is stored in the control register 1611. The control command includes reading of data stored in the read only memory 1616, writing of data to the random access memory 1615, an arithmetic instruction to the central processing unit 1614, and the like. The central processing unit 1614 accesses the read only memory 1616, the random access memory 1615, and the control register 1611 via the interface 1613. The interface 1613 has a function of generating an access signal for any one of the read only memory 1616, the random access memory 1615, and the control register 1611 based on an address requested by the central processing unit 1614.

As an arithmetic method of the central processing unit 1614, a method may be employed in which an operating system (OS) is stored in the read only memory 1616 and a program is read at the time of starting operation and then executed. Alternatively, a method may be employed in which an arithmetic circuit is formed and an arithmetic processing is conducted using hardware. In a method in which both hardware and software are used, a method can be employed in which part of process is conducted in the circuit dedicated to arithmetic and the other part of the arithmetic process is conducted by the central processing unit 1614 using a program.

Since an integrated circuit in the wireless tag 1600 of the present invention is formed using a single-crystal semiconductor layer whose crystals are oriented in a certain direction and which is bonded to a substrate having an insulating surface, higher processing speed and lower power consumption can be achieved. Further, in the wireless tag 1600 which is manufactured using the semiconductor substrate of the present invention, higher integration is achieved by stacking single-crystal semiconductor layers. Accordingly, the area of a semiconductor element having high performance can be reduced; thus, a small-sized wireless tag having high performance can be provided.

This embodiment mode can be combined with any of Embodiment Modes 1 to 3, as appropriate.

Embodiment Mode 5

This embodiment mode describes an electronic device using a semiconductor device of the present invention, particularly using a display device, with reference to FIGS. 17A to 17H.

Examples of electronic devices which are manufactured using a semiconductor device of the present invention include cameras such as a video camera and a digital camera, a goggle-type display (a head-mounted display), a navigation system, an audio reproducing device (such as car audio components), a computer, a game machine, a portable information terminal (such as a mobile computer, a cellular phone, a portable game machine, and an electronic book), an image reproducing device provided with a recording medium (specifically, a device for reproducing a recording medium such as a digital versatile disc (DVD) and having a display for displaying the reproduced image), and the like.

Figure 17A:
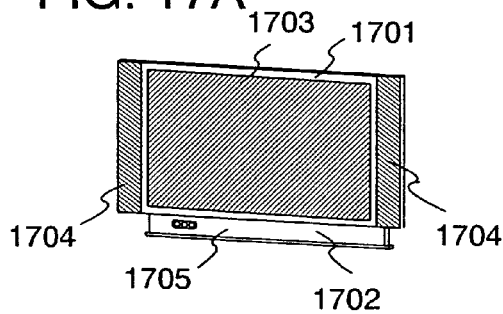
FIGS. 17A to 17H are diagrams showing electronic devices using semiconductor devices of the present invention.

FIG. 17A illustrates a monitor of a television receiving device or a personal computer, which includes a housing 1701, a support base 1702, a display portion 1703, speaker portions 1704, a video input terminal 1705, and the like. A semiconductor device of the present invention is used for the display portion 1703. According to the present invention, a high-performance and highly reliable television receiving device or personal computer can be provided.

Figure 17B:
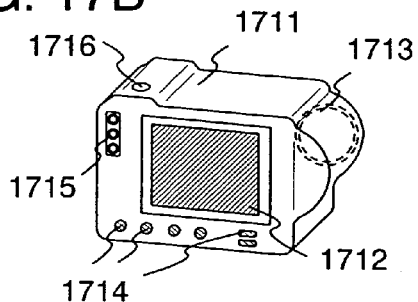

FIG. 17B illustrates a digital camera. An image receiving portion 1713 is provided in the front side of a main body 1711. A shutter button 1716 is provided at the upper portion of the main body 1711. A display portion 1712, operation keys 1714, and an external connection port 1715 are provided at the backside of the main body 1711. A semiconductor device of the present invention is used for the display portion 1712. According to the present invention, a high-performance and highly reliable digital camera can be provided.

Figure 17C:
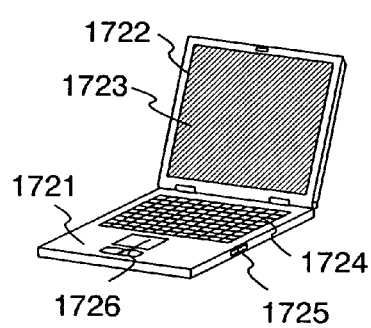

FIG. 17C illustrates a laptop personal computer. A main body 1721 is provided with a keyboard 1724, an external connection port 1725, and a pointing device 1726. A housing 1722 including a display portion 1723 is attached to the main body 1721. A semiconductor device of the present invention is used for the display portion 1723. According to the present invention, a high-performance and highly reliable laptop personal computer can be provided.

Figure 17D:
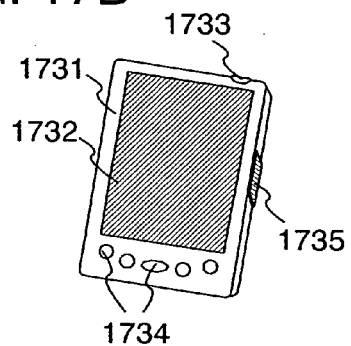

FIG. 17D illustrates a mobile computer, which includes a main body 1731, a display portion 1732, a switch 1733, operation keys 1734, an infrared port 1735, and the like. An active matrix display device is provided for the display portion 1732. A semiconductor device of the present invention is used for the display portion 1732. According to the present invention, a high-performance and highly reliable mobile computer can be provided.

Figure 17E:
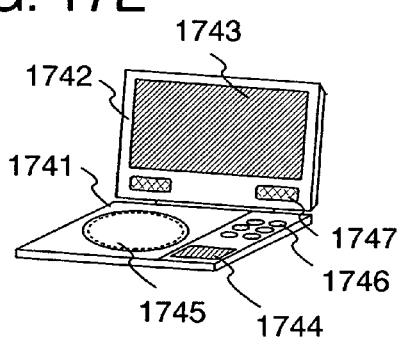

FIG. 17E illustrates an image reproducing device. A main body 1741 is provided with a display portion B 1744, a recording medium reading portion 1745, and operation keys 1746. A housing 1742 including a speaker portion 1747 and a display portion A 1743 is attached to the main body 1741. A semiconductor device of the present invention is used for each of the display portion A 1743 and the display portion B 1744. According to the present invention, a high-performance and highly reliable image reproducing device can be provided.

Figure 17F:
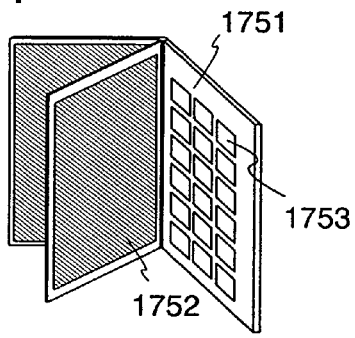

FIG. 17F illustrates an electronic book. A main body 1751 is provided with operation keys 1753. A plurality of display portions 1752 are attached to the main body 1751. A semiconductor device of the present invention is used for the display portions 1752. According to the present invention, a high-performance and highly reliable electronic book can be provided.

Figure 17G:
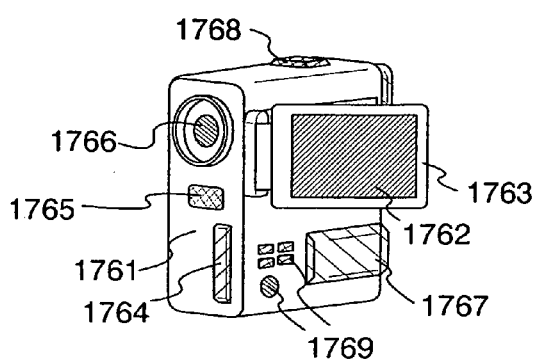

FIG. 17G illustrates a video camera. A main body 1761 is provided with an external connection port 1764, a remote control receiving portion 1765, an image receiving portion 1766, a battery 1767, an audio input portion 1768, and operation keys 1769. A housing 1763 including a display portion 1762 is attached to the main body 1761. A semiconductor device of the present invention is used for the display portion 1762. According to the present invention, a high-performance and highly reliable video camera can be provided.

Figure 17H:
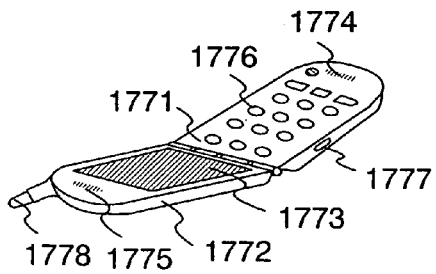
Figure 18A:
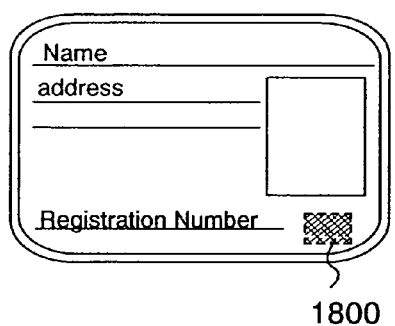
FIGS. 18A to 18F are diagrams showing applications of a semiconductor device of the present invention.
Figure 18B:
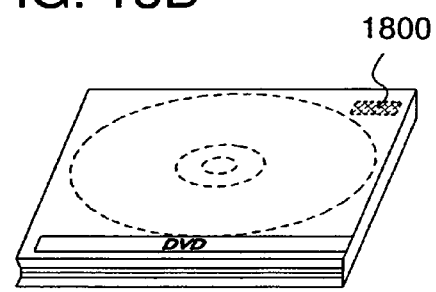
Figure 18C:
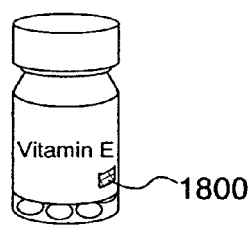
Figure 18D:
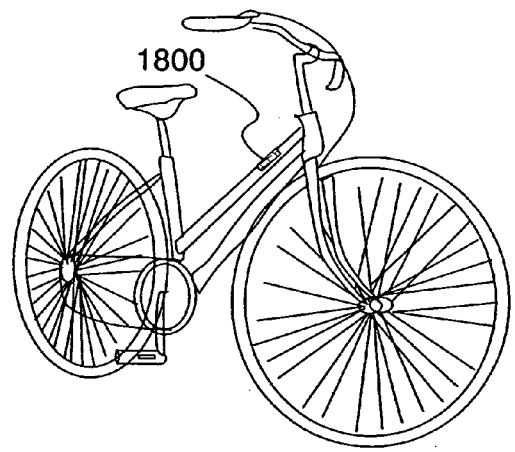
Figure 18E:
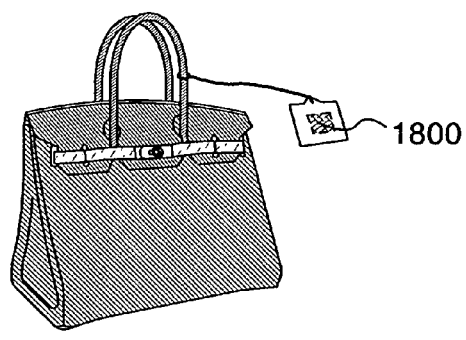
Figure 18F:
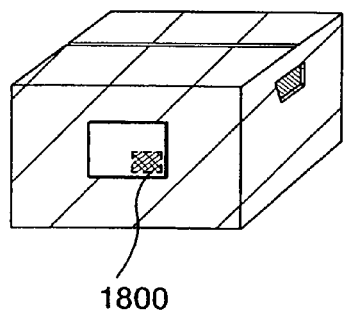

FIG. 17H illustrates a cellular phone, which includes a main body 1771, a housing 1772, a display portion 1773, an audio input portion 1774, an audio output portion 1775, operation keys 1776, an external connection port 1777, an antenna 1778, and the like. A semiconductor device of the present invention is used for the display portion 1773. According to the present invention, a high-performance and highly reliable cellular phone can be provided.

As described above, the application range of the present invention is extremely wide and electronic devices of every field can be used. Note that this embodiment mode can be implemented by being combined with any of Embodiment Modes 1 to 4, as appropriate.

Embodiment Mode 6

This embodiment mode will describe applications of a semiconductor device, in particular, a wireless tag of the present invention with reference to FIGS. 18A to 18F.

According to the present invention, a semiconductor device which functions as a wireless tag can be formed. A wireless tag can be used in a wide variety of applications, and may be used by being mounted on objects such as bills, coins, securities, bearer bonds, certificates (driver's licenses, resident cards, and the like, see FIG. 18A), containers for wrapping objects (wrapping paper, bottles, and the like, see FIG. 18C), recording media (DVD software, video tapes, and the like, see FIG. 18B), vehicles (bicycles and the like, see FIG. 18D), personal belongings (bags, glasses, and the like), foods, plants, clothes, lifestyle goods, and products such as electronic devices, or shipping tags of baggage (see FIGS. 18E and 18F). Note that the wireless tags are denoted by reference numeral 1800 in FIGS. 18A to 18F.

Note that the electronic device refers to objects shown in Embodiment Mode 5 as well as a liquid crystal display device, an EL display device, a television unit (also simply referred to as a TV, a TV receiver, or a television receiver), a cellular phone, and the like, for example. In addition, the above-described semiconductor device can be used for animals, human bodies, or the like.

The wireless tag is attached to a surface of an object, or incorporated to be fixed on an object. For example, the wireless tag may be incorporated in paper of a book, or in an organic resin of a container formed from an organic resin for wrapping an object. By providing an RFID tag in bills, coins, securities, bearer bonds, certificates, and the like, forgery can be prevented. Further, by providing an RFID tag in containers for wrapping objects, recording media, personal belongings, foods, clothes, lifestyle goods, electronic devices, and the like, inspection systems, rental systems and the like can be performed more efficiently. The wireless tag that can be formed according to the present invention has high performance and high reliability, and can be applied to various objects.

When the wireless tag that can be formed according to the present invention is applied to management system or a distribution system of goods, the system can have high functionality. For example, information which is recorded in an RFID tag provided in a tag is read by a reader/writer provided near a conveyor belt, then information about a distribution process or a delivery destination is read out, and inspection of merchandise or distribution of goods can be easily carried out.

As described above, the application range of the present invention is extremely wide and the present invention can be applied to objects of every field. Note that this embodiment mode can be combined with any of Embodiment Modes 1 to 5, as appropriate.

This application is based on Japanese Patent Application serial no. 2007-181762 filed with Japan Patent Office on Jul. 11, 2007, the entire contents of which are hereby incorporated by reference.

What is claimed is:

1. A method for manufacturing a semiconductor device comprising the steps of:

forming a first damaged region in a first single-crystal semiconductor substrate;

bonding the first single-crystal semiconductor substrate and a substrate having an insulating surface with a bonding layer interposed therebetween;

separating the first single-crystal semiconductor substrate, so that a first single-crystal semiconductor layer is left over the substrate having the insulating surface;

forming a first gate insulating layer over the first single-crystal semiconductor layer;

forming a gate electrode over the first gate insulating layer, wherein the gate electrode overlaps the first single-crystal semiconductor layer;

forming a first interlayer insulating layer over the gate electrode;

planarizing an upper surface of the first interlayer insulating layer;

forming a second gate insulating layer over the gate electrode and the first interlayer insulating layer;

forming a second damaged region in a second single-crystal semiconductor substrate;

bonding the second single-crystal semiconductor substrate and the substrate having the insulating surface with the second gate insulating layer interposed therebetween;

separating the second single-crystal semiconductor substrate, so that a second single-crystal semiconductor layer is left over the second gate insulating layer, wherein the second single-crystal semiconductor layer overlaps the gate electrode and the first single-crystal semiconductor layer, wherein the gate electrode is in contact with the second gate insulating layer, and wherein the second gate insulating layer is in contact with the second single-crystal semiconductor layer.

2. The method for manufacturing a semiconductor device according to claim 1, wherein the first damaged region is formed by irradiating the first single-crystal semiconductor substrate with first ions, and wherein the second damaged region is formed by irradiating the second single-crystal semiconductor substrate with second ions.

3. The method for manufacturing a semiconductor device according to claim 1, wherein each of the bonding layer and the second gate insulating layer is a silicon oxide film.

4. The method for manufacturing a semiconductor device according to claim 1, wherein each of the bonding layer and the second gate insulating layer is a silicon oxide film, and wherein the silicon oxide film is formed by a chemical vapor deposition method with the use of organic silane gas.

5. The method for manufacturing a semiconductor device according to claim 1, wherein the first interlayer insulating layer includes an organic insulating material.

6. The method for manufacturing a semiconductor device according to claim 1, wherein a complementary circuit is formed of a first transistor including the first single-crystal semiconductor layer and a second transistor including the second single-crystal semiconductor layer.

7. The method for manufacturing a semiconductor device according to claim 1, wherein the gate electrode is exposed by planarizing the upper surface of the first interlayer insulating layer.

* * * * *